US008933532B2

(12) United States Patent
Edwards et al.

(10) Patent No.: US 8,933,532 B2
(45) Date of Patent: Jan. 13, 2015

(54) SCHOTTKY DIODE WITH BURIED LAYER IN GAN MATERIALS

(75) Inventors: Andrew Edwards, San Jose, CA (US); Hui Nie, Cupertino, CA (US); Isik C. Kizilyalli, San Francisco, CA (US); Richard J. Brown, Los Gatos, CA (US); David P. Bour, Cupertino, CA (US); Linda Romano, Sunnyvale, CA (US); Thomas R. Prunty, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 16 days.

(21) Appl. No.: 13/270,641

(22) Filed: Oct. 11, 2011

(65) Prior Publication Data

US 2013/0087879 A1    Apr. 11, 2013

(51) Int. Cl.
*H01L 29/872* (2006.01)
*H01L 29/808* (2006.01)
(Continued)

(52) U.S. Cl.
CPC ........ *H01L 29/2003* (2013.01); *H01L 29/8083* (2013.01); *H01L 29/66924* (2013.01); *H01L 29/868* (2013.01); *H01L 29/66143* (2013.01); *H01L 29/404* (2013.01); *H01L 29/872* (2013.01); *H01L 29/0619* (2013.01); *H01L 29/66083* (2013.01)
USPC .... 257/484; 257/472; 257/495; 257/E29.013; 257/E29.327; 257/E29.338; 438/571; 438/572

(58) Field of Classification Search
CPC ............ H01L 29/0615; H01L 29/0619; H01L 29/0623; H01L 29/6606; H01L 29/66143; H01L 29/8611; H01L 29/8613; H01L 29/8618; H01L 29/872

USPC ............ 257/76, 183, 200, 472, 487, 615, 616
See application file for complete search history.

(56) References Cited

U.S. PATENT DOCUMENTS 6,325,850 B1    12/2001  Beaumont et al.
6,844,251 B2 *   1/2005  Shenai et al. ................. 438/571
(Continued)

OTHER PUBLICATIONS

Notification of Transmittal of the International Search Report and the Written Opinion of the International Searching Authority, or the Declaration and International Search Report and Written Opinion of the International Searching Authority for International Application No. PCT/US2012/059250 mailed on Dec. 7, 2012, 10 pages.

(Continued)

*Primary Examiner* — Julio J Maldonado
*Assistant Examiner* — Molly Reida
(74) *Attorney, Agent, or Firm* — Kilpatrick Townsend & Stockton LLP

(57) ABSTRACT

A semiconductor structure includes a III-nitride substrate characterized by a first conductivity type and having a first side and a second side opposing the first side, a III-nitride epitaxial layer of the first conductivity type coupled to the first side of the III-nitride substrate, and a plurality of III-nitride epitaxial structures of a second conductivity type coupled to the III-nitride epitaxial layer. The semiconductor structure further includes a III-nitride epitaxial formation of the first conductivity type coupled to the plurality of III-nitride epitaxial structures, and a metallic structure forming a Schottky contact with the III-nitride epitaxial formation and coupled to at least one of the plurality of III-nitride epitaxial structures.

22 Claims, 29 Drawing Sheets

(51) Int. Cl.
*H01L 29/66* (2006.01)
*H01L 29/20* (2006.01)
*H01L 29/868* (2006.01)
*H01L 29/40* (2006.01)
*H01L 29/06* (2006.01)

(56) References Cited

U.S. PATENT DOCUMENTS

| | | | |
|---|---|---|---|
| 6,949,401 B2 * | 9/2005 | Kaminski et al. | 438/92 |
| 2002/0117681 A1 | 8/2002 | Weeks et al. | |
| 2005/0167697 A1 | 8/2005 | Flynn et al. | |
| 2006/0046331 A1 | 3/2006 | Kiyama et al. | |
| 2006/0118900 A1 * | 6/2006 | Zeghbroeck | 257/483 |
| 2007/0096239 A1 | 5/2007 | Cao et al. | |
| 2007/0215885 A1 | 9/2007 | Miyoshi et al. | |
| 2008/0121993 A1 | 5/2008 | Hefner et al. | |
| 2008/0203517 A1 | 8/2008 | Rueb et al. | |
| 2008/0251793 A1 * | 10/2008 | Mazzola et al. | 257/77 |
| 2009/0166677 A1 | 7/2009 | Shibata et al. | |
| 2009/0206913 A1 | 8/2009 | Zeng et al. | |
| 2010/0320476 A1 * | 12/2010 | Cheng et al. | 257/77 |
| 2011/0031522 A1 | 2/2011 | Oya et al. | |
| 2011/0057199 A1 | 3/2011 | Pan et al. | |
| 2011/0215338 A1 | 9/2011 | Zhang | |

OTHER PUBLICATIONS

International Search Report and Written Opinion of PCT/US2012/59245 mailed Dec. 11, 2012, 20 pages.
International Search Report and Written Opinion of PCT/US2012/59250 mailed Dec. 7, 2012, 13 pages.

* cited by examiner

SCHOTTKY DIODE WITH BURIED LAYER IN GAN MATERIALS

CROSS-REFERENCES TO RELATED APPLICATIONS

The following regular U.S. patent applications (including this one) are being filed concurrently, and the entire disclosure of the other applications are incorporated by reference into this application for all purposes:

application Ser. No. 13/270,606, filed Oct. 11, 2011, entitled "METHOD AND SYSTEM FOR FLOATING GUARD RINGS IN GAN MATERIALS";

application Ser. No. 13/270,625, filed Oct. 11, 2011, entitled "METHOD FOR FABRICATING A GAN MERGED PIN, SCHOTTKY (MPS) DIODE"; and application Ser. No. 13/270,641, filed Oct. 11, 2011 entitled "SCHOTTKY DIODE WITH BURIED LAYER IN GAN MATERIALS".

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming edge termination structures using III-nitride semiconductor materials. Merely by way of example, the invention has been applied to methods and systems for manufacturing guard rings for semiconductor devices using gallium-nitride (GaN) based epitaxial layers. The methods and techniques can be applied to a variety of compound semiconductor systems such as Schottky diodes, PIN diodes, vertical junction field-effect transistors (JFETs), thyristors, and other devices.

According to one embodiment of the present invention, a method of fabricating a diode in GaN materials is provided. The method includes providing a n-type GaN substrate having a first surface and a second surface, forming a first n-type GaN epitaxial layer coupled to the first surface of the n-type GaN substrate, and forming a p-type GaN epitaxial layer coupled to the first n-type GaN epitaxial layer. The method further includes removing at least a portion of the p-type GaN epitaxial layer to form a plurality of p-type device structures, forming a second n-type GaN epitaxial layer coupled to the plurality of p-type device structures, and removing at least a portion of the second n-type GaN epitaxial layer to expose a portion of at least one p-type device structure. The method also includes forming a first metallic structure electrically coupled to the exposed portion of the at least one p-type device structure and a remaining portion of the second n-type GaN epitaxial layer.

According to another embodiment of the present invention, a method of fabricating an epitaxial structure is provided. The method includes providing a III-nitride substrate of a first conductivity type, forming a first III-nitride epitaxial layer of the first conductivity type coupled to a first surface of the III-nitride substrate, and forming a second III-nitride epitaxial layer of a second conductivity type coupled to the first III-nitride epitaxial layer. The method also includes removing at least a portion of the second III-nitride epitaxial layer to form a plurality of epitaxial structures of the second conductivity type, forming a third III-nitride epitaxial layer of the first conductivity type coupled to the plurality of epitaxial structures, and forming a first metallic structure electrically coupled to at least one of the plurality of epitaxial structures and a portion of the third III-nitride epitaxial layer.

According to yet another embodiment of the present invention, a semiconductor structure is provided. The semiconductor structure includes a III-nitride substrate characterized by a first conductivity type and having a first side and a second side opposing the first side, a III-nitride epitaxial layer of the first conductivity type coupled to the first side of the III-nitride substrate, and a plurality of III-nitride epitaxial structures of a second conductivity type coupled to the III-nitride epitaxial layer. The semiconductor structure further includes a III-nitride epitaxial formation of the first conductivity type coupled to the plurality of III-nitride epitaxial structures, and a metallic structure forming a Schottky contact with the III-nitride epitaxial formation and coupled to at least one of the plurality of III-nitride epitaxial structures.

Numerous benefits are achieved by way of the present invention over conventional techniques. For example, embodiments of the present invention enable the use of thicker III-nitride semiconductor layers in vertical device configuration in comparison with conventional techniques, which can result in devices capable of operating at higher voltages and lower resistance than conventional devices. Additionally, the use of etching techniques detailed herein provides enhanced accuracy over conventional techniques, providing more precise placement of edge termination structures. These and other embodiments of the invention, along with many of its advantages and features, are described in more detail in conjunction with the text below and attached figures.

Figure 1A:
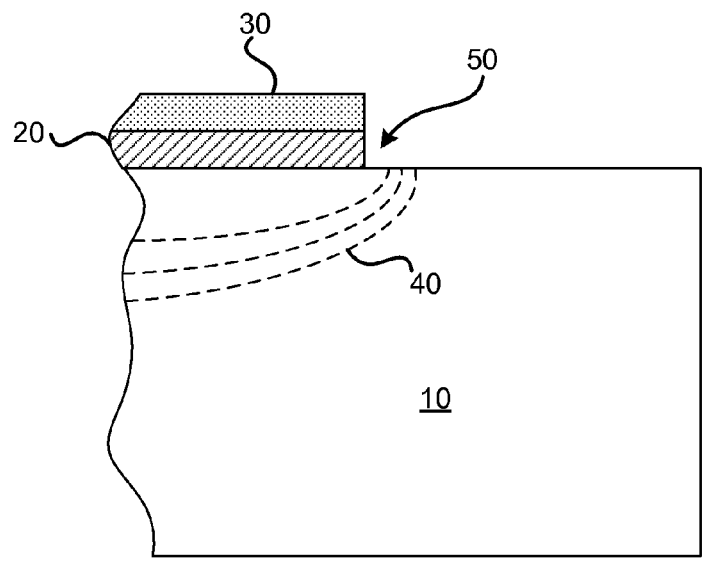
FIGS. 1A-1B are simplified cross-sectional diagrams of a portion of a semiconductor device, illustrating how edge termination structures improve the semiconductor device's performance, according to an embodiment of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention relate to electronic devices. More specifically, the present invention relates to forming edge termination structures, such as floating guard rings, to provide edge termination for semiconductor devices. Merely by way of example, the invention has been applied to methods and systems for manufacturing edge termination structures using gallium-nitride (GaN) based epitaxial layers. The methods and techniques can be applied to form a variety of types of edge termination structures that can provide edge termination to numerous types of semiconductor devices, including, but not limited to, junction field-effect transistors (JFETs), diodes, thyristors, vertical field-effect transistors, thyristors, and other devices, including merged PIN, Schottky diodes such as those discussed in the Application entitled "METHOD AND SYSTEM FOR FLOATING GUARD RINGS IN GAN MATERIALS" incorporated by reference hereinabove.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N}, \qquad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \qquad (2)$$

where A is the cross-sectional area of the channel or current path.

As described herein, semiconductor devices utilizing edge termination structures are able to exploit the high critical electric field provided by GaN and related alloys and heterostructures. Edge termination techniques such as field plates and guard rings provide proper edge termination by alleviating high fields at the edge of the semiconductor device. When properly employed, edge termination allows a semiconductor device to break down uniformly at its main junction rather than uncontrollably at its edge.

According to embodiments of the present invention, gallium nitride (GaN) epitaxy on pseudo-bulk GaN substrates is utilized to fabricate edge termination structures and/or semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

Figure 1B:
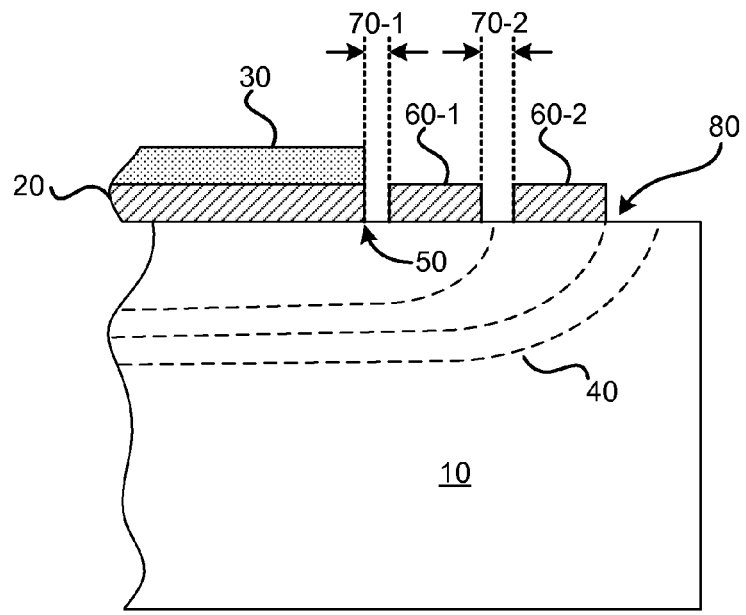

FIGS. 1A-1B are simplified cross-sectional diagrams of a portion of a semiconductor device, according to one embodiment, illustrating how the edge termination structures provided herein can be used to improve the semiconductor device's performance using edge termination. FIG. 1A illustrates a diode structure where a p-n junction is created between a p-type semiconductor layer 20 formed on an n-type semiconductor substrate 10, which can be an epitaxial layer. In this example, a metal layer 30 is also formed on the p-type semiconductor layer 20 to provide electrical connectivity to the diode. Layer 30 may or may not share the same edge as layer 20 in FIG. 1A and FIG. 1B.

Because the diode of FIG. 1A has no termination structures, its performance is reduced. The electric field 40 (represented in FIG. 1A as potential lines), is crowded near the edge 50 of the diode, causing breakdown at a voltage that can be much less than the parallel plane breakdown voltage for the diode. This phenomenon can be especially detrimental to the operation of high-voltage semiconductor devices.

FIG. 1B illustrates how edge termination structures 60 can be used to alleviate field crowding near the edge 50 of the diode. The edge termination structures 60, which can be made of the same p-type semiconductor material as the p-type semiconductor layer 20 of the diode, are placed near the diode and given voltages such that the electric field 40 extends laterally beyond the edge 50 of the diode. By extending the potential drop and reducing the electric field in this manner, the edge termination structures 60 help enable the diode to operate at a breakdown voltage much closer to its parallel plane breakdown voltage.

The number of edge termination structures 60 can vary. In some embodiments, a single edge termination structure may be sufficient. In other embodiments, as much as seven termination structures or more can be used. The number of termination structures also can impact voltages at which each termination structure is biased. For example, the voltage for each termination structure can be decreased with each successive termination structure such that the termination structure farthest from the semiconductor device has the lowest voltage. For example, if the p-type semiconductor layer 20 is biased at 600V, the edge termination structures 60-1 and 60-2 can float to 400V and 200V, respectively. Of course, voltages can vary, depending on the physical dimensions and configuration of the semiconductor device and edge termination structures 60. However, ensuring the outermost edge termination structure 60-2 has sufficiently low voltage such that the electric field at its edge is lower than the peak field at the semiconductor's main junction can help ensure the semiconductor device operates at or near its parallel plane breakdown voltage.

The spaces 70 between edge termination structures 60 can vary. According to some embodiments, width of the spaces 70 between edge termination structures 60 can increase as the distance from the semiconductor structure increases. For example, as shown in the embodiment of FIG. 1B, the width of a first space 70-1 between the first edge termination structure 60-1 and the semiconductor structure can be smaller than the second space 70-2 between the second edge termination structure 60-2 and the first edge termination structure 60-1. The width of the spaces 70 can vary depending on application. According one embodiment, the width of edge termination structures 60, ranging from 1 µm to 5 µm, can be approximately the same for all edge termination structures 60, and the width of spaces 70 between edge termination structures 60 increases with increased distance from the semiconductor device, ranging anywhere from 0.5 µm to 6 µm. In other embodiments, other spacings are utilized as appropriate to the particular application.

Methods for the formation of edge termination structures in GaN and related alloys and heterostructures can differ from those used in other semiconductors, such as Si. In Si, for example, edge termination structures often are formed by using implantation into the semiconductor substrate. On the other hand, in GaN and related alloys and heterostructures, using the techniques described herein, an epitaxial layer can be formed on a substrate, then etched to provide the edge termination structures 60. The formation of the edge termination structures 60 using etching can provide better spatial control than implantation, allowing better control of the position and spacing of the edge termination structures 60, and, ultimately, better control of the electric field 40.

Figure 2:
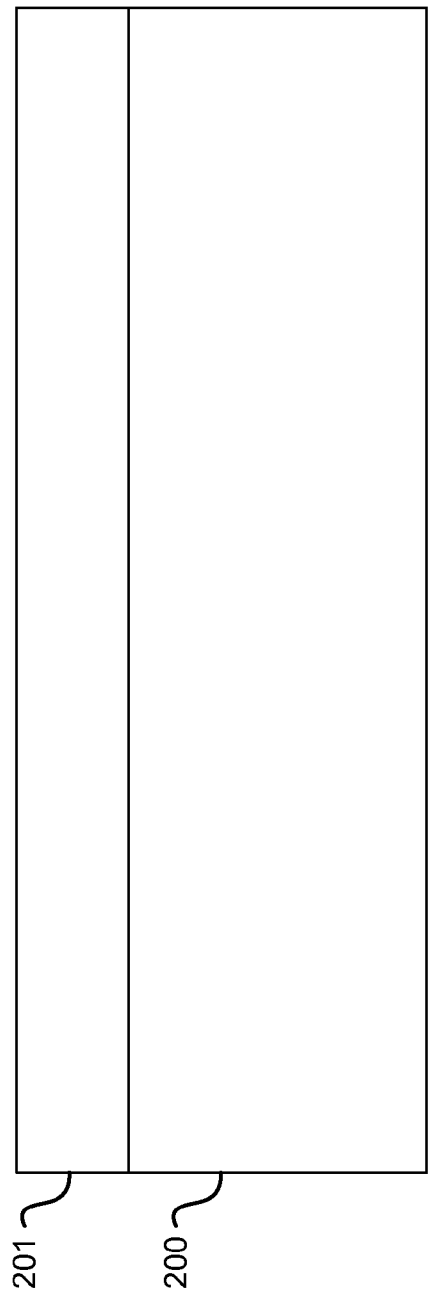
FIGS. 2-7 are simplified cross-sectional diagrams illustrating the fabrication of a Schottky diode in gallium-nitride (GaN) with edge termination structures formed through the etching of an epitaxial layer according to an embodiment of the present invention.

FIGS. 2-7B illustrate a process for creating a Schottky diode in GaN with edge termination structures formed through the etching of an epitaxial layer. Referring to FIG. 2, a first GaN epitaxial layer 201 is formed on a GaN substrate 200 having the same conductivity type. As indicated above, the GaN substrate 200 can be a pseudo-bulk or bulk GaN material on which the first GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift region for the Schottky diode, and therefore can be a relatively low-doped material. For example, the first GaN epitaxial layer 201 can have an n−conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 µm and 100 µm, for example. In other embodiments thicknesses are greater than 5 µm. Resulting parallel plane breakdown voltages for the Schottky diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, calcium zinc, or the like.

Figure 3:
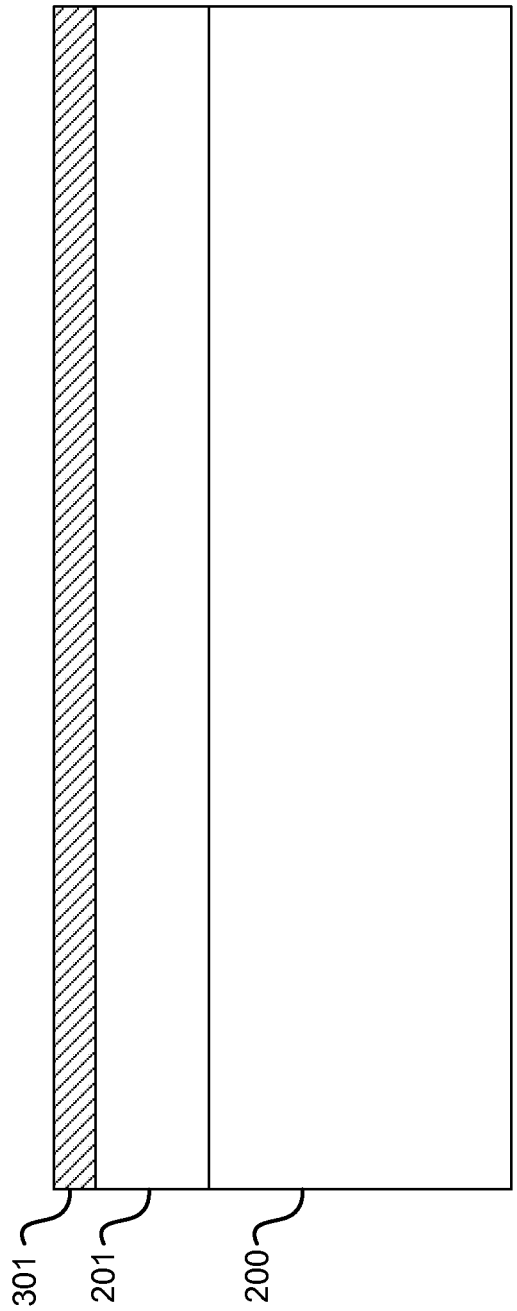

FIG. 3 illustrates the formation of a second GaN epitaxial layer 301 above the first GaN epitaxial layer 201. The second GaN epitaxial layer 301, from which edge termination structures are eventually formed, can have a conductivity type different than the first GaN epitaxial layer 201. For instance, if the first GaN epitaxial layer 201 is formed from an n-type GaN material, the second GaN epitaxial layer 301 will be formed from a p-type GaN material, and vice versa. In some embodiments, the second GaN epitaxial layer 301 used to form the edge termination structures is a continuous regrowth over portions of the first GaN epitaxial layer 201 with other portions of the structure, such as regions of other semiconductor devices, characterized by reduced or no growth as a result of the presence of a regrowth mask (not shown). One of ordinary skill in the art would recognize many variations, modifications, and alternatives.

The thickness of the second GaN epitaxial layer 301 can vary, depending on the process used to form the layer and the device design. In some embodiments, the thickness of the second GaN epitaxial layer 301 is between 0.1 µm and 5 µm. In other embodiments, the thickness of the second GaN epitaxial layer 301 is between 0.3 µm and 1 µm.

The second GaN epitaxial layer 301 can be highly doped, for example in a range from about $5\times10^{17}$ cm$^{-3}$ to about $1\times10^{19}$ cm$^{-3}$. Additionally, as with other epitaxial layers, the dopant concentration of the second GaN epitaxial layer 301 can be uniform or non-uniform as a function of thickness. In some embodiments, the dopant concentration increases with thickness, such that the dopant concentration is relatively low near the first GaN epitaxial layer 201 and increases as the distance from the first GaN epitaxial layer 201 increases. Such embodiments provide higher dopant concentrations at the top of the second GaN epitaxial layer 301 where metal contacts can be subsequently formed. Other embodiments utilize heavily doped contact layers (not shown) to form ohmic contacts.

One method of forming the second GaN epitaxial layer 301, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 4:
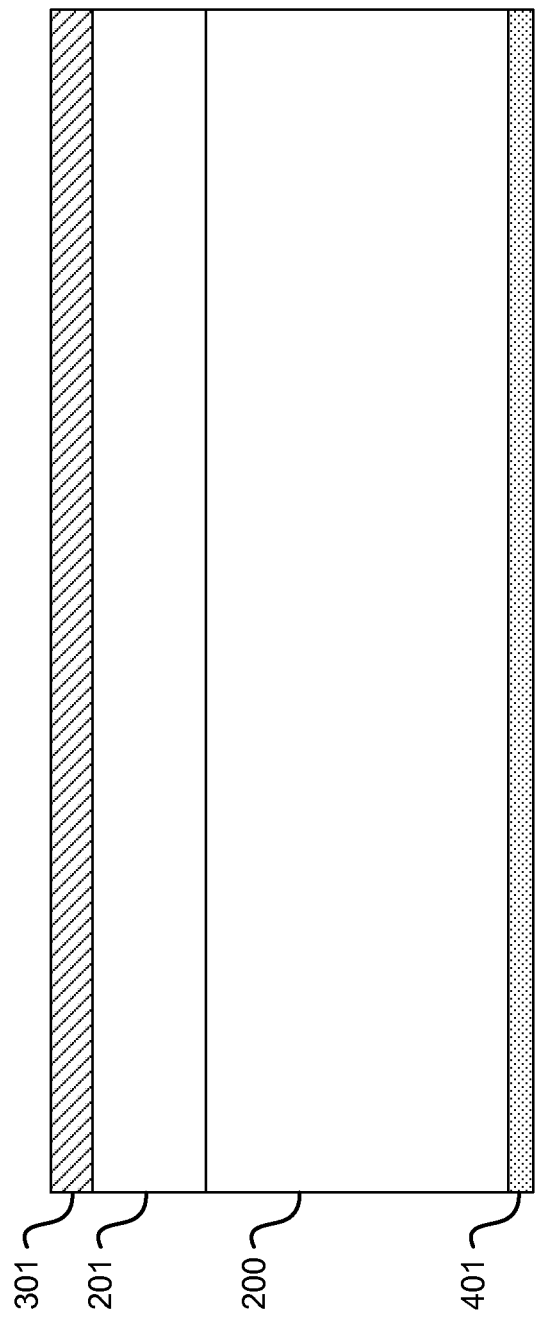

FIG. 4 illustrates the formation of a first metallic structure 401 below the GaN substrate 200. The first metallic structure 401 can be one or more layers of ohmic metal that serve as a contact for the cathode of the Schottky diode. For example, the metallic structure 401 can comprise a titanium-aluminum (Ti/Al) ohmic metal. Other metals and/or alloys can be used including, but not limited to, aluminum, nickel, gold, combinations thereof, or the like. In some embodiments, an outermost metal of the metallic structure 401 can include gold, tantalum, tungsten, palladium, silver, or aluminum, combinations thereof, and the like. The first metallic structure 401 can be formed using any of a variety of methods such as sputtering, evaporation, or the like.

Figure 5:
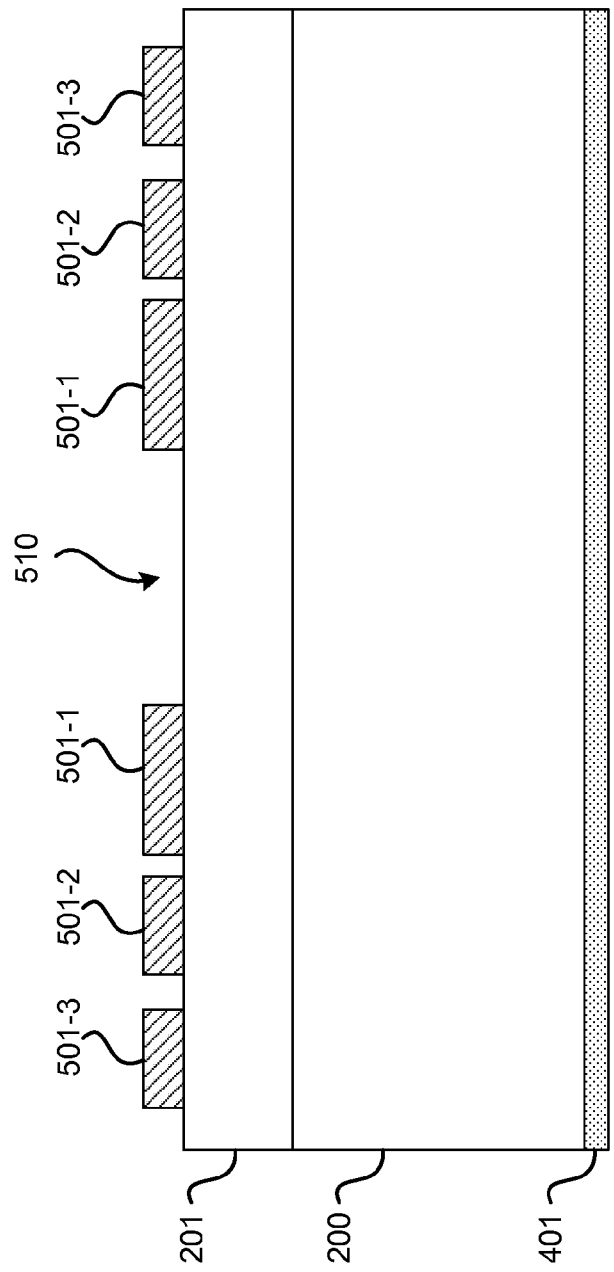

FIG. 5 is a simplified cross-sectional diagram illustrating the removal at least a portion of the second GaN epitaxial layer 301 to form edge termination structures 501. As discussed in further detail below, edge termination structures 501 can include any of a variety of structures, such as guard rings that circumscribe the Schottky diode to provide edge termination. Additionally, as illustrated in FIG. 5, at least a portion of the second GaN epitaxial layer 301 is removed to form an exposed portion 510 of the first GaN epitaxial layer 201 with which the Schottky diode can subsequently be formed. The removal can be performed by a controlled etch using an etch mask (not shown but having the dimensions of the edge termination structures 501) designed to stop at approximately the interface between the second GaN epitaxial layer 301 and the first GaN epitaxial layer 201. Inductively-coupled plasma (ICP) etching and/or other common GaN etching processes can be used. In the illustrated embodiment, the material removal process used to remove portions of the second GaN epitaxial layer 301 terminates at the interface of layers 301 and layer 201, however, in other embodiments, the process terminates at a different depth, for example, extending into or leaving a portion of the first GaN epitaxial layer 201.

Figure 6:
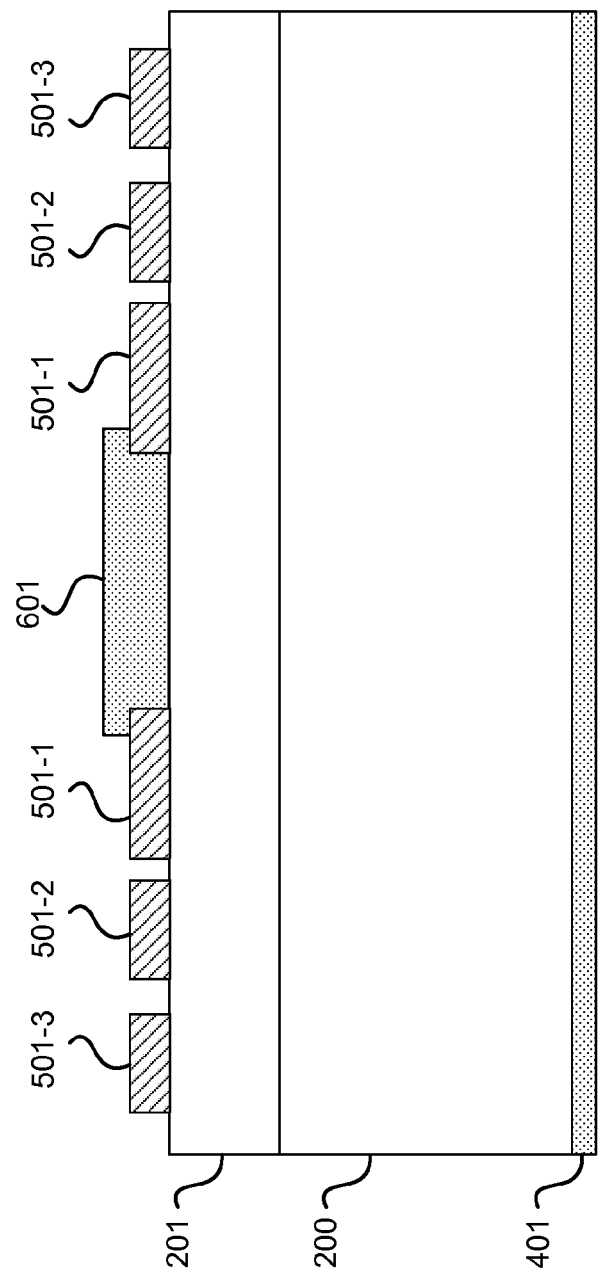

FIG. 6 illustrates the formation of a second metallic structure 601 on the exposed portion 510 of the first GaN epitaxial layer 201. The second metallic structure 601 can be one or more layers of metal and/or alloys to create a Schottky barrier with the first GaN epitaxial layer 201, and the second metallic structure 601 further can overlap portions of the nearest edge termination structure 501-1. The second metallic structure 601 can be formed using a variety of techniques, including lift-off and/or deposition with subsequent etching, which can vary depending on the metals used. In some embodiments, the contact metal structure 601 can include nickel, platinum, palladium, silver, gold, and the like.

Figure 7A:
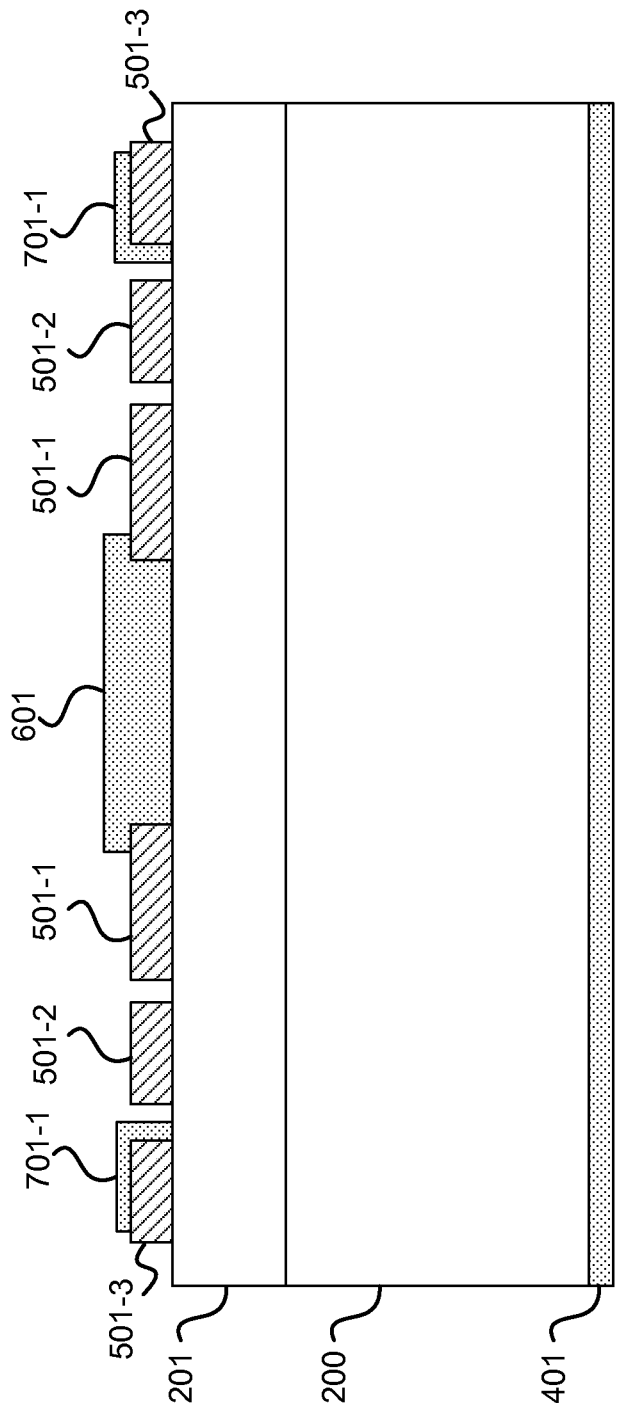

FIG. 7A illustrates the formation of metallic field plates 701 coupled to the outer edge termination structure 501-3. These metallic field plates 701 can be formed using the same techniques used to form the second metallic structure 601, and also can include similar metals and/or alloys. In alternative embodiments, the metallic field plates 701 can be located on any or all of the edge termination structures 501 and may be coupled to an exposed surface of the first GaN epitaxial layer 201, as shown in FIG. 7A. One of ordinary skill in the art would recognize many variations, modifications, and alternatives.

Figure 7B:
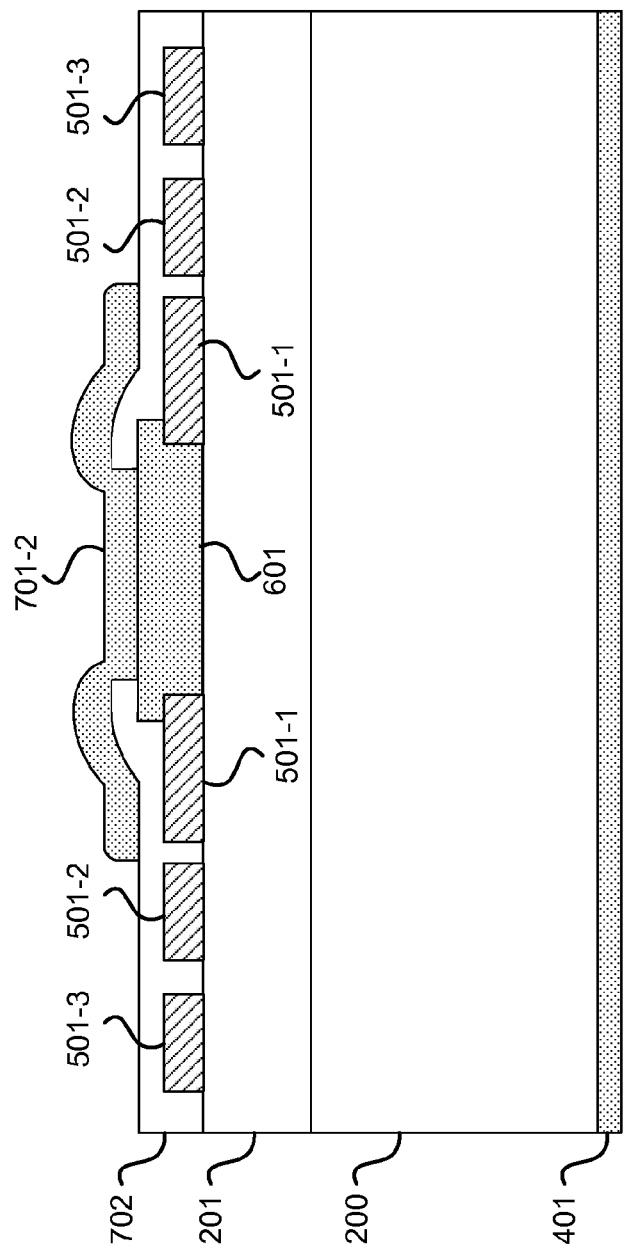

FIG. 7B illustrates the formation of additional field plate 701-2 coupled to metallic structure 601, as an alternative to the embodiment of FIG. 7A. The metallic field plate 701-2 can be formed after dielectric layer 702 is deposited and patterned. The pattern can be formed by a controlled etch using a etch mask (not shown but patterned to expose the metallic structure 601). In alternative embodiments, the metallic field plate 701-2 can be located on one or multiple edge termination structures 501. One of ordinary skill in the art would recognize many variations, modifications, and alternatives.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIG. 2, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The fabrication process illustrated in FIGS. 2-7B utilizes a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Figure 8:
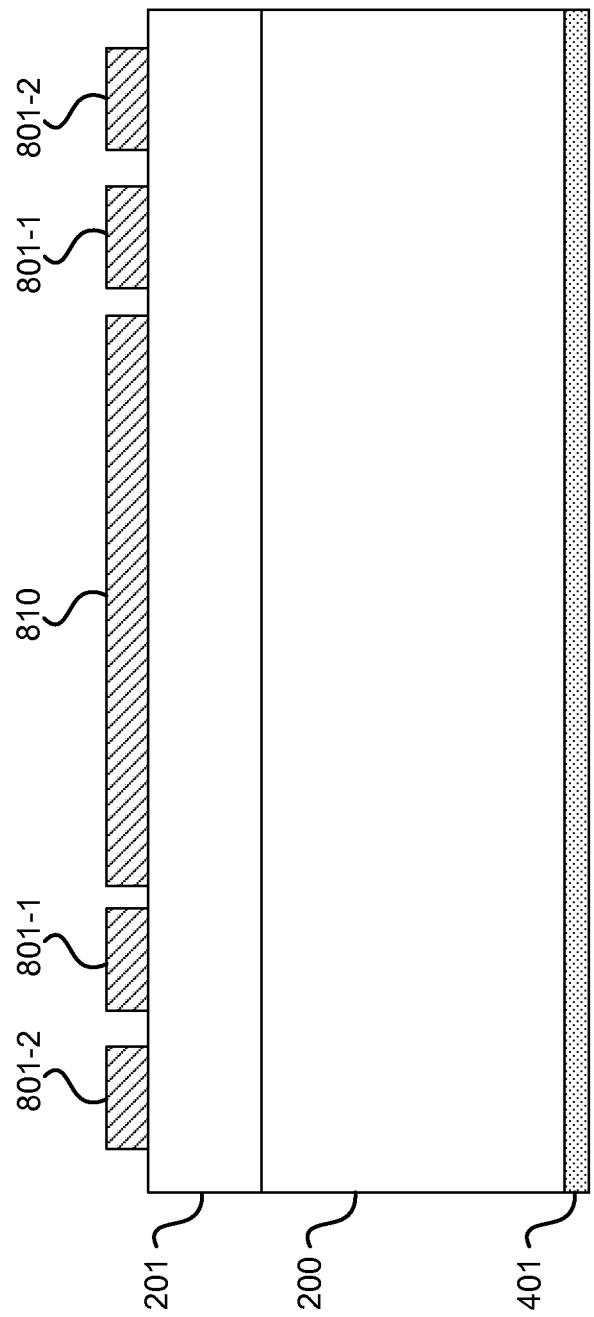
FIGS. 8-10 are simplified cross-sectional diagrams illustrating fabrication of a PIN diode in GaN with edge termination structures formed through the etching of an epitaxial layer according to another embodiment of the present invention.
Figure 9:
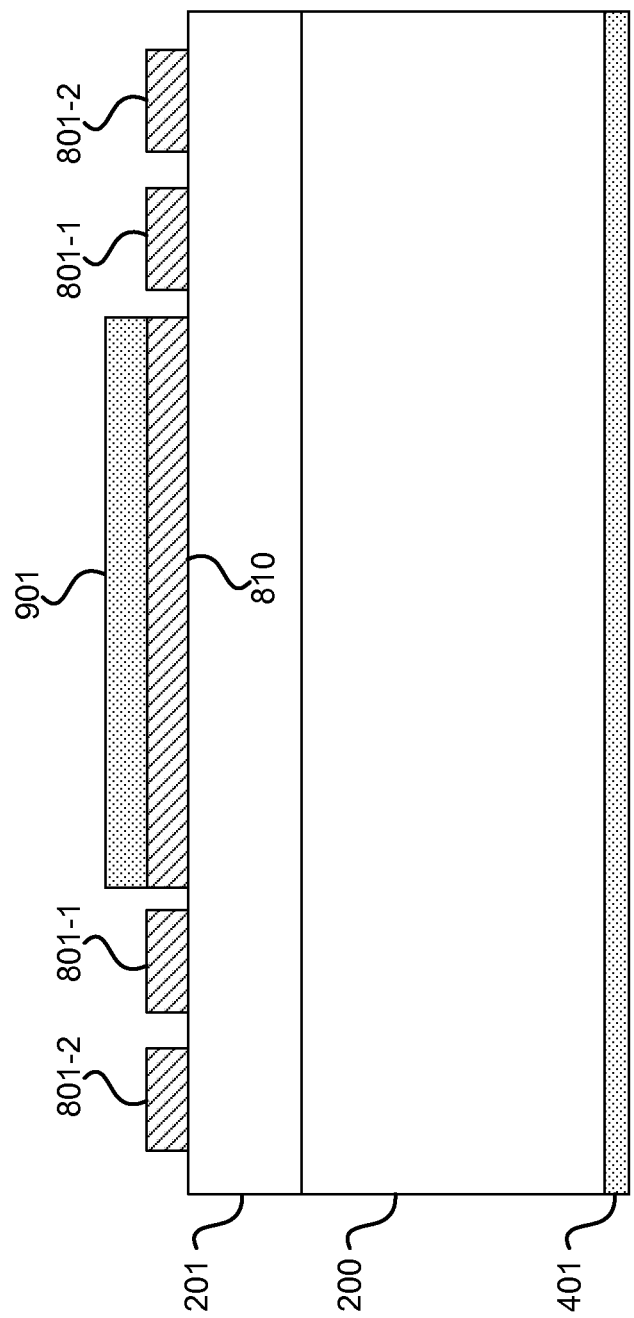
Figure 10:
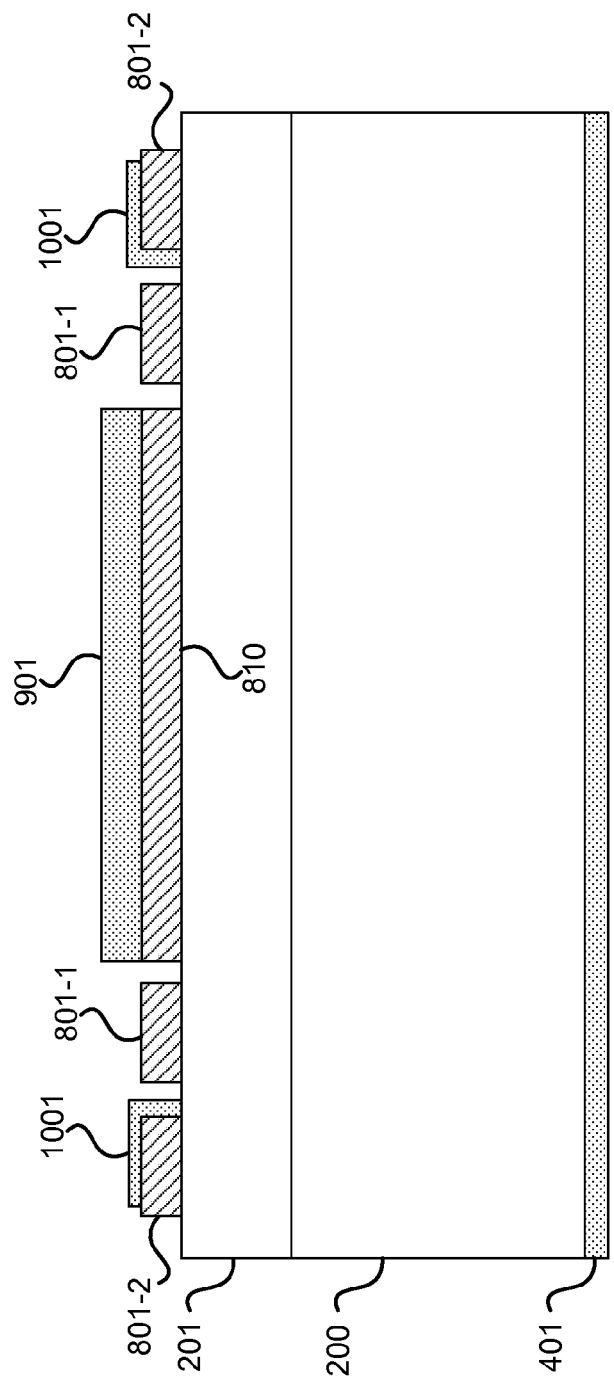

FIGS. 8-10, illustrate a process for creating a PIN diode in GaN with edge termination structures formed through the etching of an epitaxial layer. The process can begin with the same steps of providing a GaN substrate 200, a first GaN epitaxial layer 201, a second GaN epitaxial layer 301, and a first metallic structure 401, as shown in FIGS. 2-4. The structure properties, such as dopant concentrations and thicknesses, can vary from those of a Schottky diode, depending on desired functionality.

FIG. 8 illustrating the removal at least a portion of the second GaN epitaxial layer 301 (illustrated in FIG. 3) to form edge termination structures 801 configured to provide edge termination to the PIN diode. Additionally, as illustrated in FIG. 8, at least a portion of the second GaN epitaxial layer 301 is left, forming a device structure 810 with which the PIN diode can be made. For example, in one embodiment, the device structure 810 can have a p+ conductivity type, the first GaN epitaxial layer 201 can have a n− conductivity type, and the GaN substrate 200 can have an n+ conductivity type, forming the PIN layers of the PIN diode. As discussed in reference to FIG. 5, the removal can be performed by a controlled etch using an etch mask (not shown but having the dimensions of the edge termination structures 801) designed to stop at approximately the interface between the second GaN epitaxial layer 301 and the first GaN epitaxial layer 201. Inductively-coupled plasma (ICP) etching and/or other common GaN etching processes can be used.

FIG. 9 illustrates the formation of a second metallic structure 901 (in addition to the metallic structure 401) electrically coupled to the device structure 810. This second metallic structure 901 can be formed using the same techniques used to form the metallic structure 401, and also can include similar metals and/or alloys. The second metallic structure 901 electrically coupled to the device structure 810 can serve as an electrical contact (e.g., an anode) for the PIN diode.

FIG. 10 illustrates the formation of metallic field plates 1001 coupled to an outer edge termination structure 801-2, similar to the metallic field plates 701-1 described in reference to FIG. 7A. These metallic field plates 1001 can be formed using the same techniques used to form the metallic structures 401 and 901, and also can include similar metals and/or alloys. In alternative embodiments, the metallic field plates 1001 can be located on any or all of the edge termination structures 801, and may be coupled to an exposed surface of the first GaN epitaxial layer 201, as shown in FIG. 10. One of ordinary skill in the art would recognize many variations, modifications, and alternatives.

Figure 11:
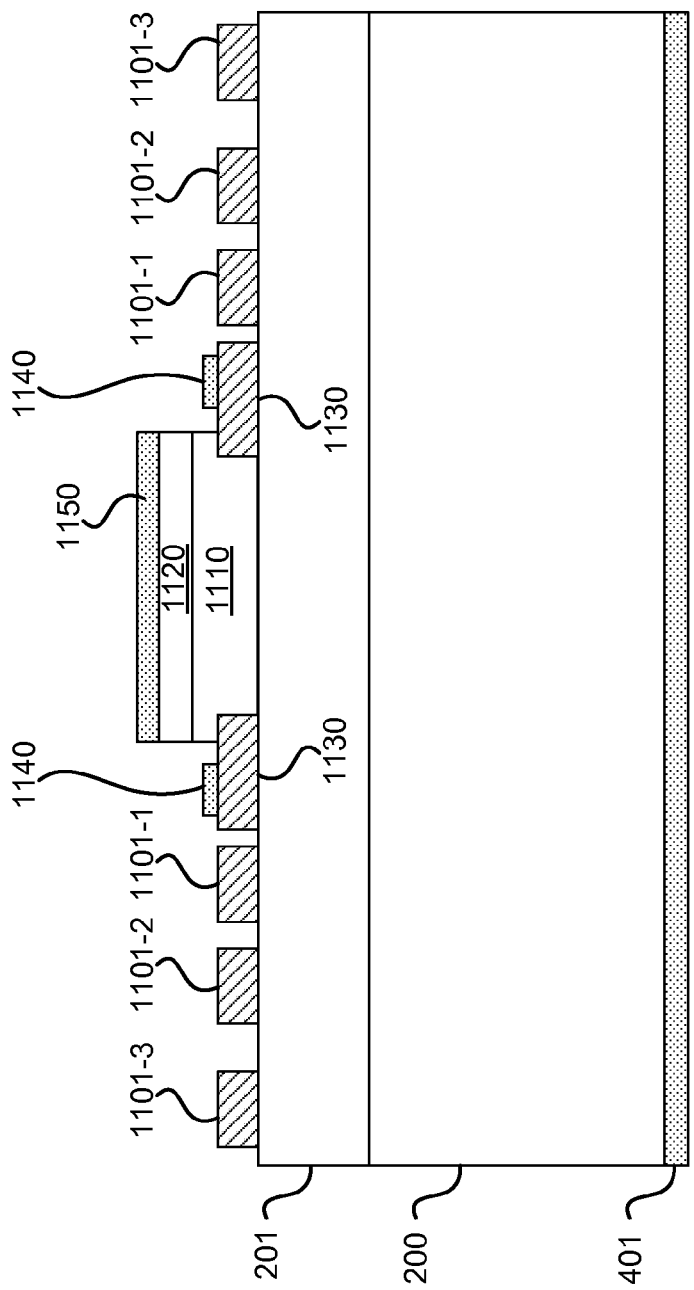
FIG. 11 is simplified cross-sectional diagram illustrating a vertical JFET with edge termination structures according to another embodiment of the present invention.

FIG. 11 is a simplified cross section of a vertical JFET with edge termination structures 1101, which can be formed using epitaxial regrowth and etching, as described herein. The vertical JFET can include a GaN substrate 200, first GaN epitaxial layer 201, and first metallic structure 401, similar to those in the structures discussed previously. Here, first metallic structure 401 can function as a drain contact of the vertical JFET. Additionally, the JFET can include a channel region 1110, which can be formed through epitaxial regrowth and have a low dopant concentration similar to the first GaN epitaxial layer 201, having the same conductivity type. Furthermore, a source region 1120 can be formed from an epitaxial layer of the same conductivity type as the channel region 1110 and the first GaN epitaxial layer 201. Gate regions 1130 can be formed from the same epitaxial growth or regrowth as the edge termination structures 1101, which has an opposite conductivity type as the first GaN epitaxial layer 201. Finally, ohmic metal contacts 1140 and 1150 can be provided on the gate regions 1130 and the source region 1120 to provide gate and source contacts, respectively.

For example, in some embodiments, the GaN substrate 200 can have an n+ conductivity type with dopant concentrations ranging from $1 \times 10^{17}$ cm$^{-3}$ to $1 \times 10^{19}$ cm$^{-3}$, and the first GaN epitaxial layer 201 can have a n− conductivity type, with dopant concentrations ranging from $1 \times 10^{14}$ cm$^{-3}$ to $1 \times 10^{18}$ cm$^{-3}$. The thickness of the first GaN epitaxial layer 201 can be anywhere from 0.5 μm and 100 μm or over 100 μm, depending on desired functionality and breakdown voltage. The channel region 1110, which can have a n− conductivity type with a dopant concentration similar to the first GaN epitaxial layer 201, can be anywhere from between 0.1 μm and 10 μm thick, and the width of the channel region 1110 (i.e., the distance between gate regions 1130) for a normally-off vertical JFET can be between 0.5 μm and 10 μm. For a normally-on vertical JFET, the width of the channel region 1110 can be greater. The source region 1120 can have a thickness of between 500 Å and 5 μm and an n-type conductivity with a dopant concentration equal to or greater than $1 \times 10^{18}$ cm$^{-3}$. The gate regions 1130 and the edge termination structures 1101-1, 1101-2, and 1101-3 can be from 0.1 μm and 5 μm thick and have a p+ conductivity type with dopant concentrations in a range from about $1 \times 10^{17}$ cm$^{-3}$ to about $1 \times 10^{19}$ cm$^{-3}$.

Figure 12:
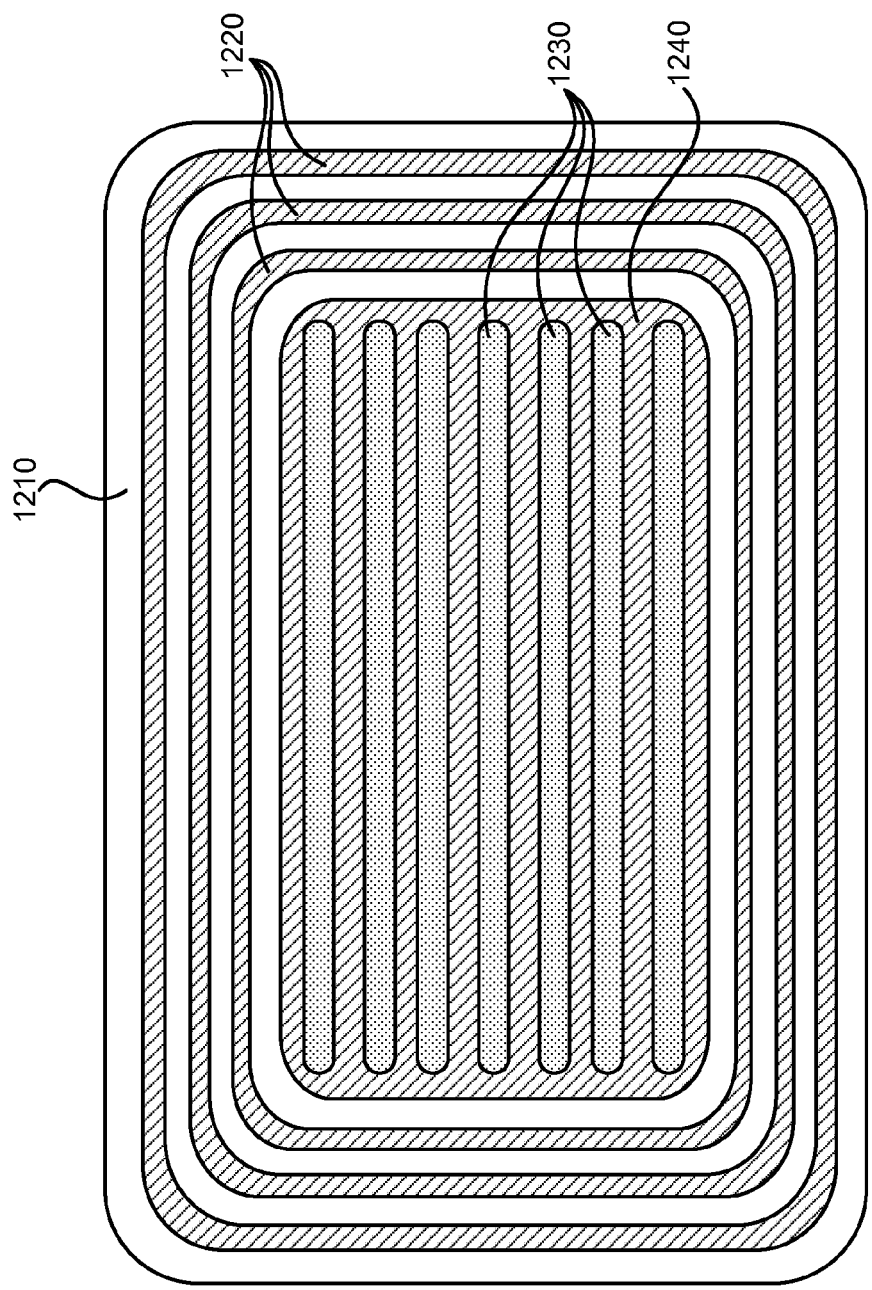
FIGS. 12-14 are simplified top-view illustrations showing different example embodiments of edge termination structures according to embodiments of the present invention.
Figure 13:
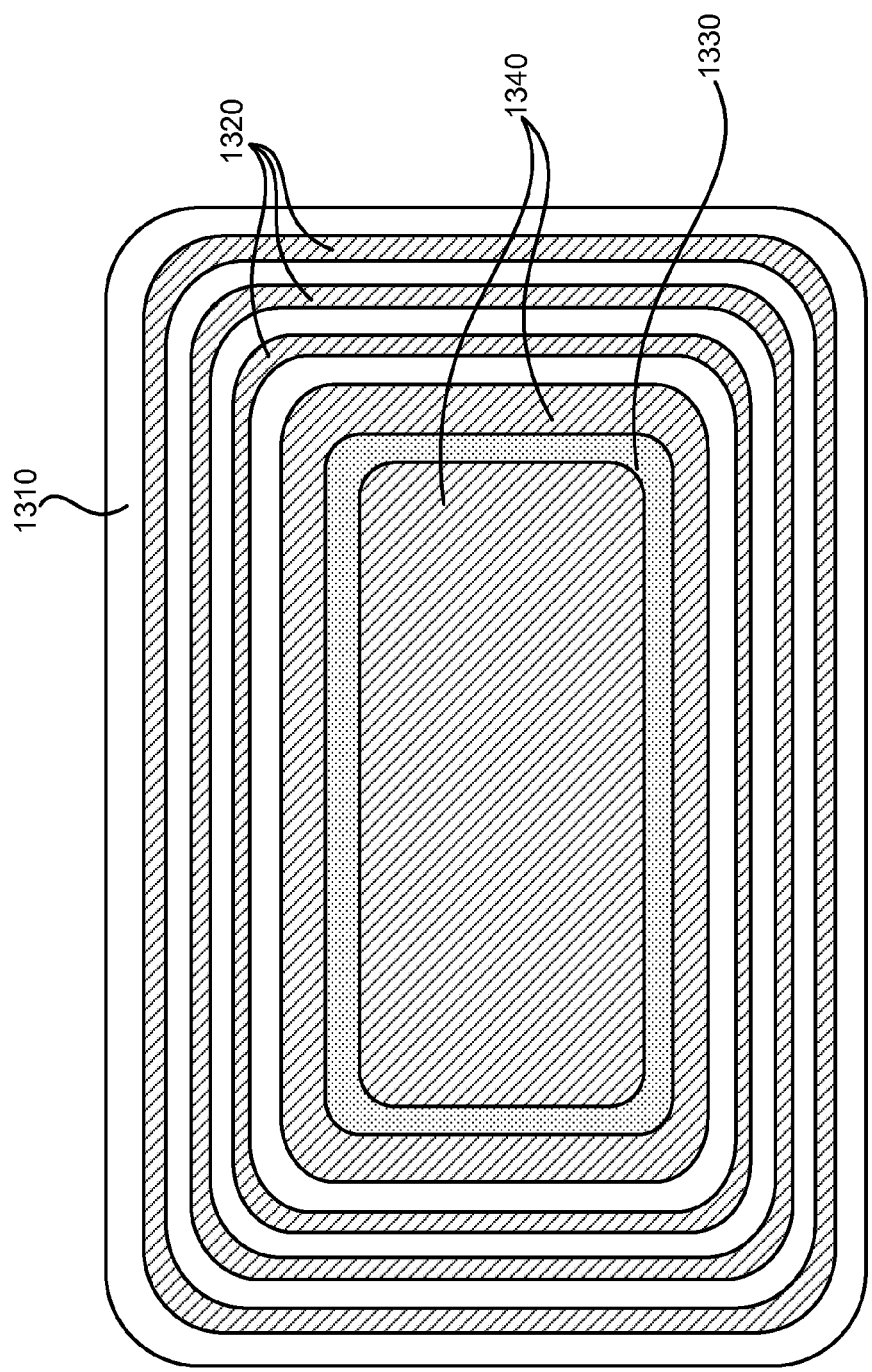
Figure 14:
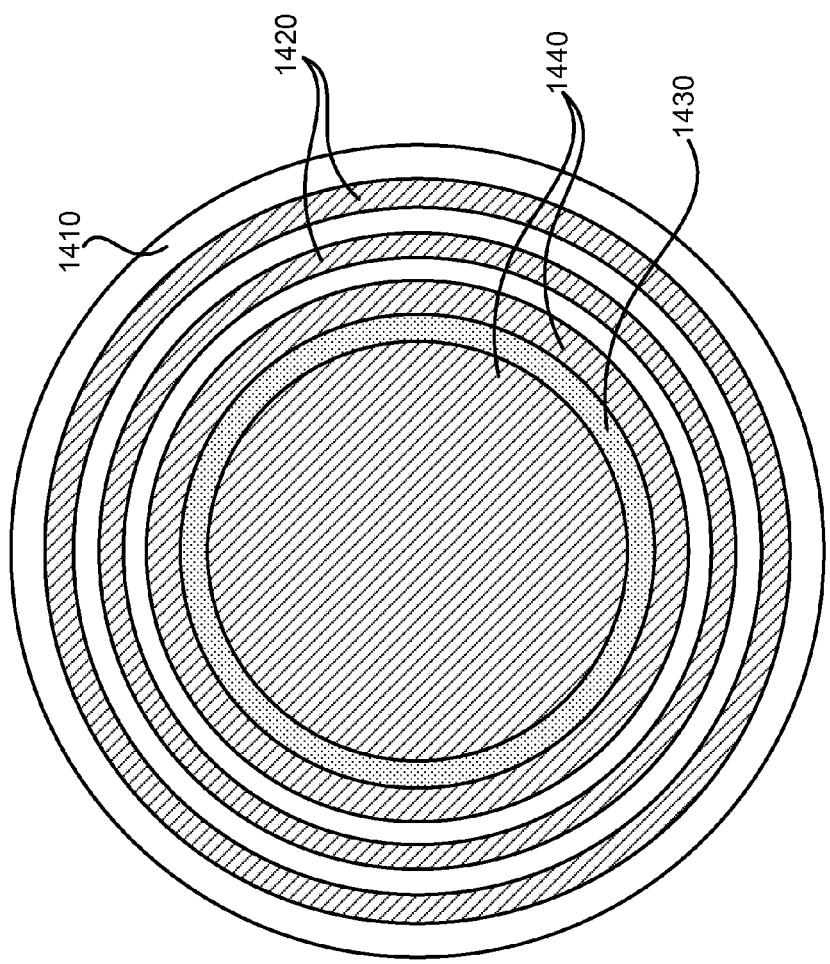

As demonstrated above, the edge termination structures described herein can provide edge termination to a variety of types of semiconductor devices. FIGS. 12-14 are simplified top-view illustrations that provide some example embodiments.

FIG. 12 illustrates an embodiment of a transistor structure with edge termination provided by three guard rings 1220. In this embodiment, the guard rings 1220 and gate structure 1240 can be made of a p+ GaN epitaxial material formed on a drift region 1210 comprised of n− GaN epitaxial layer. Multiple source regions 1230 can be made of a n+ GaN epitaxial material formed on n− GaN epitaxial channel regions located between the gates.

FIG. 13 illustrates another embodiment of a transistor structure with edge termination provided by three guard rings 1320. Similar to the embodiment shown in FIG. 12, the guard rings 1320 and gate structure 1340 can be made of a p+ GaN epitaxial material formed on a drift region 1310 comprised of n− GaN epitaxial layer. A source region 1330 can be made of a n+ GaN epitaxial material formed on n− GaN epitaxial channel region located between the gates formed from the gate structure 1340.

FIG. 14 illustrates yet another embodiment of a transistor structure similar to the embodiment shown in FIG. 13, illustrating how edge termination structures, such as guard rings 1420, can shaped differently to accommodate differently-shaped semiconductor structures. Again, guard rings 1420 and gate structure 1440 can be made of a p+ GaN epitaxial material formed on a drift region 1410 comprised of n− GaN epitaxial layer. A source region 1430 can be made of a n+ GaN epitaxial material on n− GaN epitaxial channel region located between the gates formed from the gate structure 1440.

Figure 15:
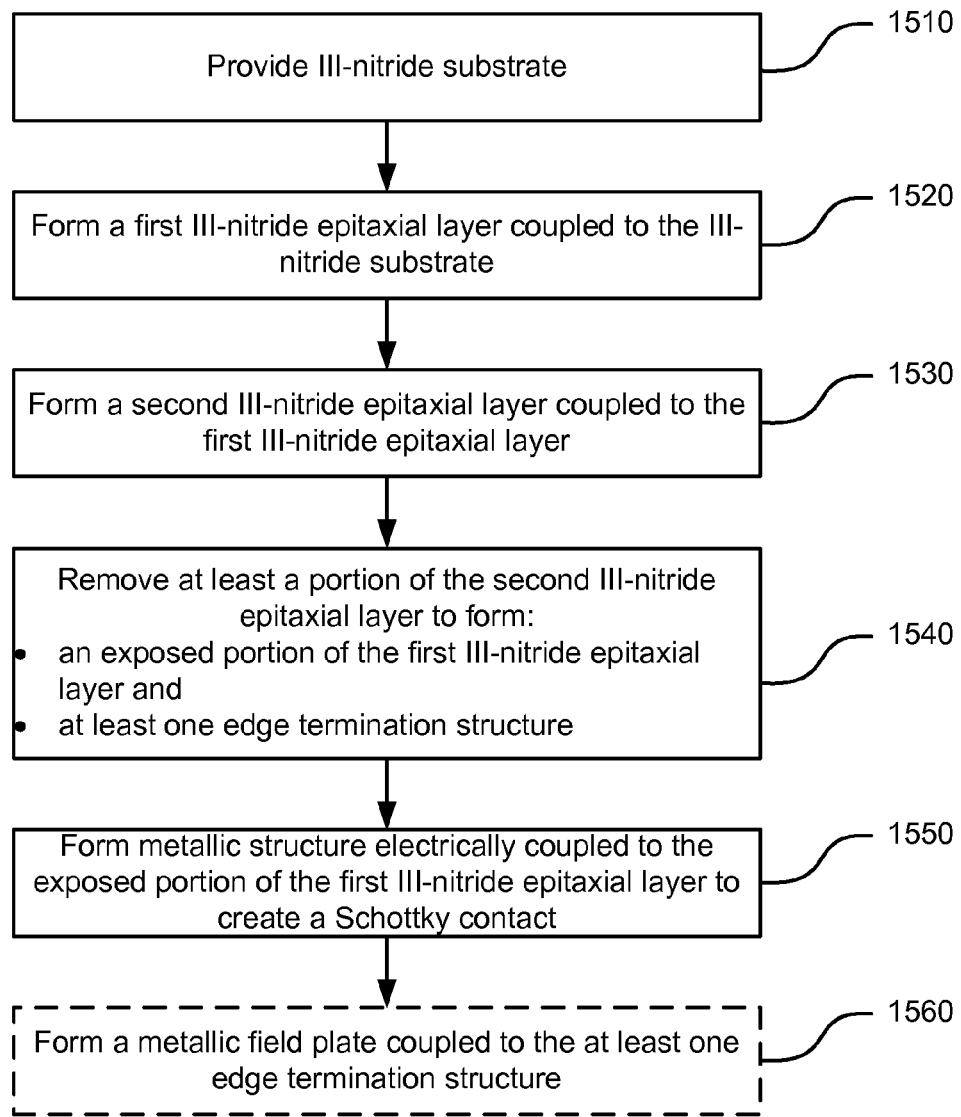
FIG. 15 is a simplified flowchart illustrating a method of fabricating a Schottky diode with edge termination structures formed through the etching of an epitaxial layer according to an embodiment of the present invention.

FIG. 15 is a simplified flowchart illustrating a method of fabricating a Schottky diode with edge termination structures in a III-nitride material, according to an embodiment of the present invention. Referring to FIG. 15, a III-nitride substrate is provided (1510), characterized by a first conductivity type and a first dopant concentration. In an embodiment, the III-nitride is a GaN substrate with n+ conductivity type. The method also includes forming a first III-nitride epitaxial layer (e.g., an n-type GaN epitaxial layer) coupled to the III-nitride substrate (1520). The III-nitride substrate and first III-nitride epitaxial layer are characterized by a first conductivity type, for example n-type conductivity, and the first III-nitride epitaxial layer is characterized by a second dopant concentration less than the first dopant concentration. Using the homoepitaxy techniques described herein, the thickness of the first III-nitride epitaxial layer can be thicker than available using conventional techniques, for example, between about 3 μm and about 100 μm.

The method further includes forming a second III-nitride epitaxial layer coupled to the first III-nitride epitaxial layer (1530). The second III-nitride epitaxial layer (e.g., a GaN epitaxial layer of a p+ conductivity type) is characterized by a second conductivity type. At least a portion of the second III-nitride epitaxial layer is removed to form an exposed portion of the first III-nitride epitaxial layer and form at least one edge termination structure (1540). As illustrated in FIGS. 12-14 and discussed elsewhere herein, any number between one to seven or more edge termination structures can be formed to provide edge termination for the Schottky diode. Furthermore, the edge termination structures can be shaped any of a variety of ways, according to the physical characteristics of the Schottky diode and other considerations.

Additionally, the method includes forming a metallic structure electrically coupled to the first III-nitride epitaxial layer to create a Schottky contact (1550) between the metallic structure and the first III-nitride epitaxial layer, which forms the drift layer. The metallic structure further can be deposited and patterned to overlap the first (i.e., closest) edge termination structures. A optional metallic field plate coupled to at least one termination structure (1560) is provided to alter or enhance edge termination, depending on desired functionality. Moreover, as illustrated in FIG. 7A, a backside ohmic metal can formed on a first surface of the III-nitride substrate opposing a surface of the III-nitride substrate coupled with the first III-nitride epitaxial layer, providing a cathode for the Schottky diode. The various epitaxial layers used to form the Schottky diode and edge termination structures do not have to be uniform in dopant concentration as a function of thickness, but may utilize varying doping profiles as appropriate to the particular application.

It should be appreciated that the specific steps illustrated in FIG. 15 provide a particular method of fabricating a Schottky diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 16:
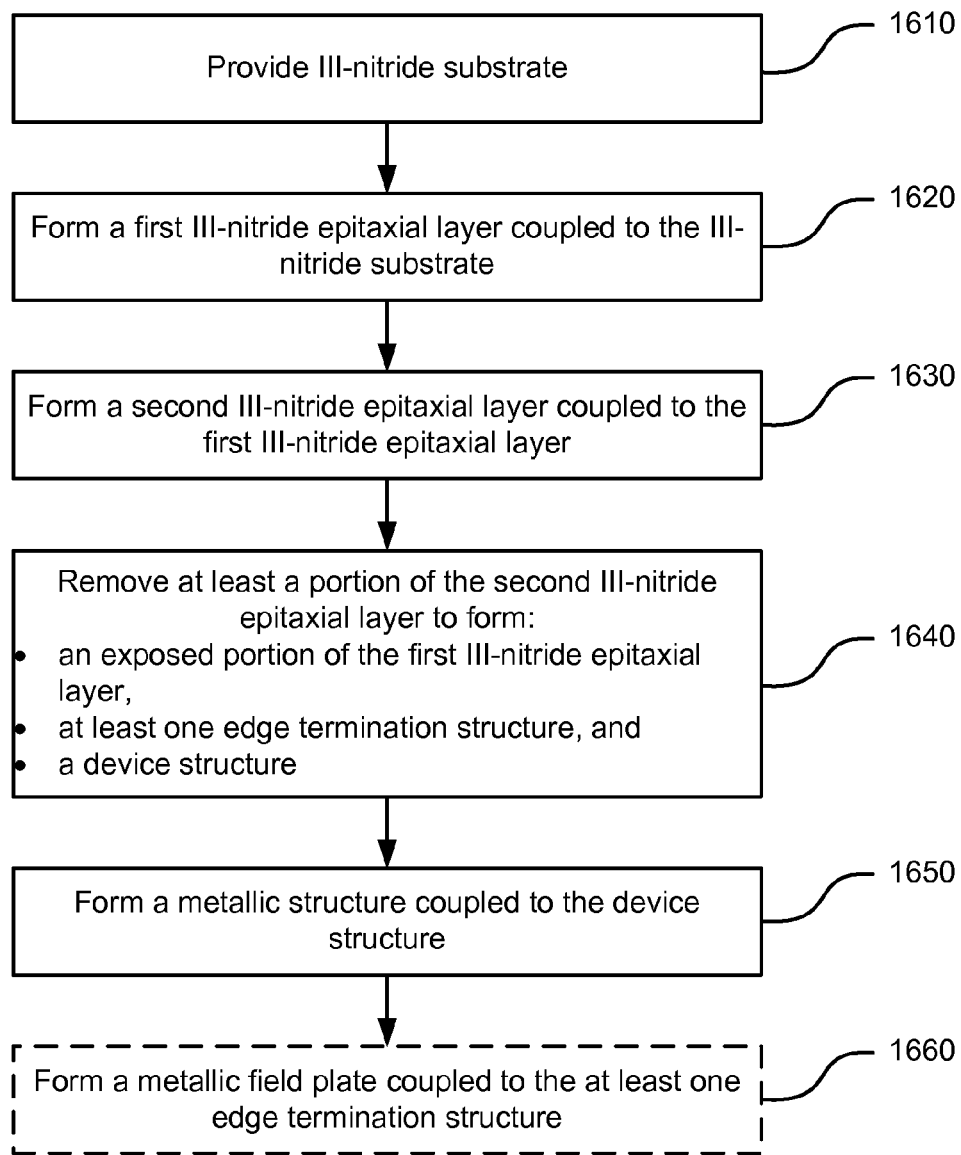
FIG. 16 is a simplified flowchart illustrating a method of fabricating a PIN diode with edge termination structures formed through the etching of an epitaxial layer according to an embodiment of the present invention.

FIG. 16 is a simplified flowchart illustrating a method of fabricating a PIN diode with edge termination structures in a III-nitride material, according to an embodiment of the present invention. Similar to the method illustrated in FIG. 15, a III-nitride substrate is provided (1610), having a first conductivity type and a first dopant concentration. The method also includes forming a first III-nitride epitaxial layer (e.g., an n-type GaN epitaxial layer) coupled to the III-nitride substrate (1620). Here, the first III-nitride epitaxial layer can be an intrinsic or very lightly doped layer to function as the intrinsic region of the PIN diode.

The method further includes forming a second III-nitride epitaxial layer coupled to the first III-nitride epitaxial layer (1630). The second III-nitride epitaxial layer (e.g., a GaN epitaxial layer of a p+ conductivity type) is characterized by a second conductivity type. At least a portion of the second III-nitride epitaxial layer is removed to form an exposed portion of the first III-nitride epitaxial layer, at least one edge termination structure, and a device structure (1640). Depending on the conductivity type of the second III-nitride epitaxial layer, the device structure forms the P or N region of the PIN diode.

The method includes forming a metallic structure electrically coupled to the device structure (1650) to create an ohmic metal contact of the PIN diode. Additionally, a metallic field plate can be coupled to at least one termination structure (1660) to alter or enhance edge termination, depending on desired functionality. Moreover, similar to the method for creating the Schottky diode, the method can include forming a backside ohmic metal coupled to the III-nitride substrate. The various epitaxial layers used to form the PIN diode and edge termination structures do not have to be uniform in dopant concentration as a function of thickness, but may utilize varying doping profiles as appropriate to the particular application.

It should be appreciated that the specific steps illustrated in FIG. 16 provide a particular method of fabricating a PIN diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

FIGS. 17A-17F are cross-sectional diagrams of a process for forming a GaN Schottky diode with a buried p-type layer with edge termination structures, according to one embodiment. The process can begin at FIG. 17A with a structure similar to that shown in FIG. 3, with a first GaN epitaxial layer 201 coupled to a GaN substrate 200, and a second GaN epitaxial layer 301 coupled to the first GaN epitaxial layer 201. In this embodiment, the first GaN epitaxial layer 201 and the GaN substrate 200 are have n-type conductivity, and the second GaN epitaxial layer 301 has a p-type conductivity. The physical properties of the structures shown in FIG. 17A can be similar to corresponding structures described in respect to in FIG. 3.

Figure 17A:
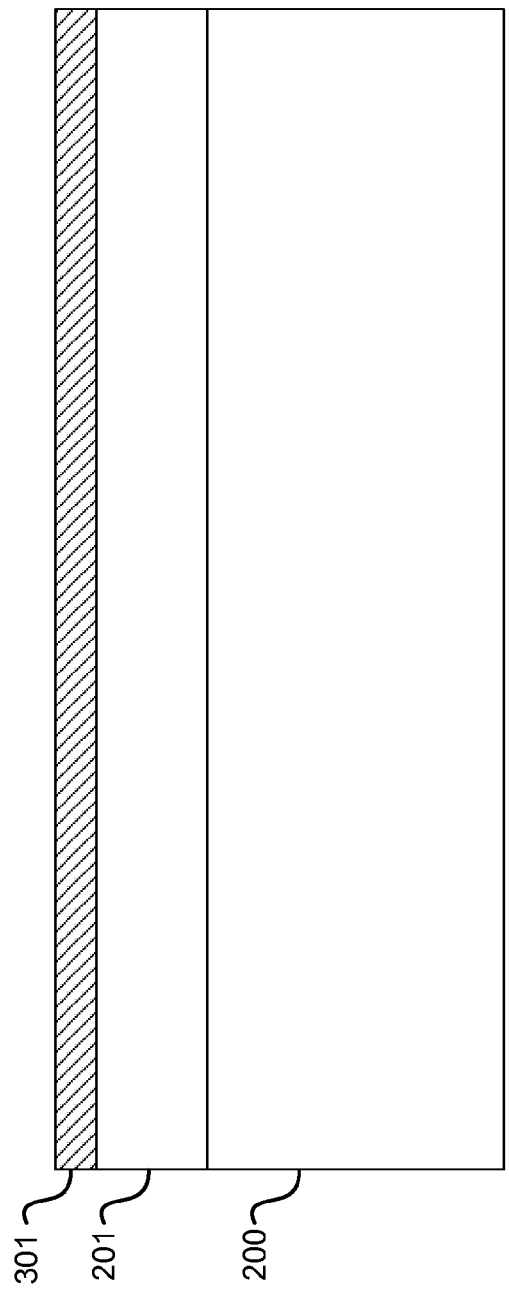
FIGS. 17A-17F are cross-sectional diagrams of a process for forming a GaN Schottky diode with a buried p-type layer with edge termination structures, according to one embodiment.
Figure 17B:
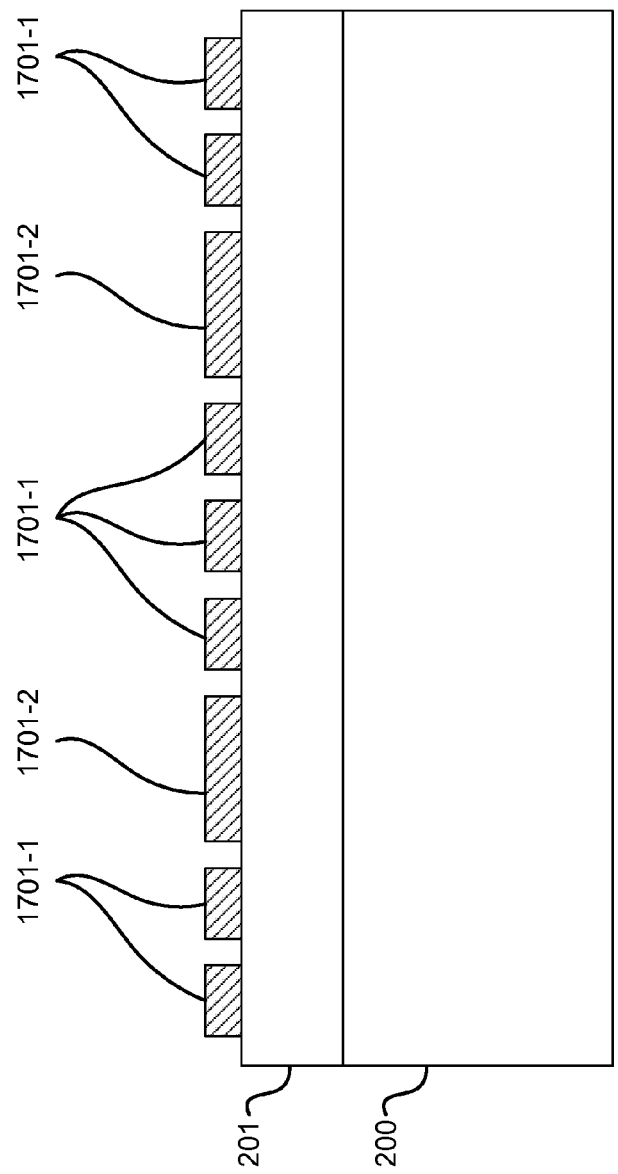
Figure 17C:
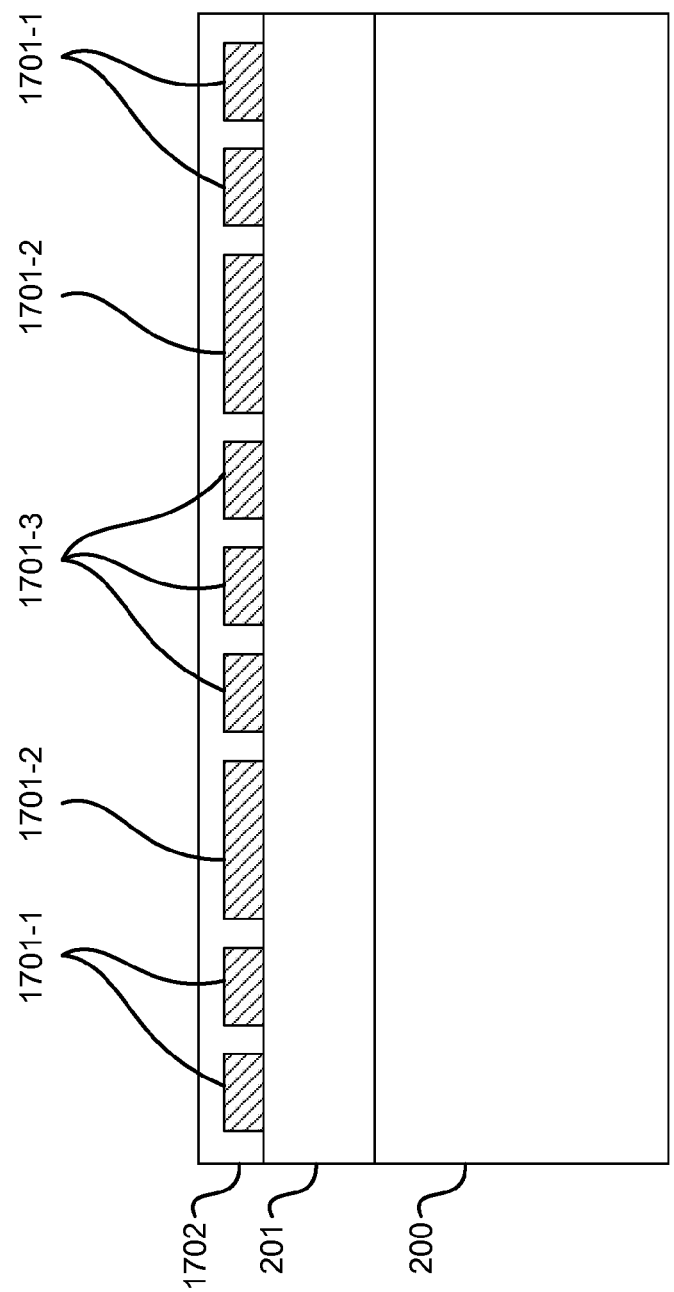

In FIG. 17B, the second GaN epitaxial layer 301 is etched to form multiple epitaxial structures 1701, and in FIG. 17C, an n-type epitaxial regrowth layer 1702 for passivation is formed over the epitaxial structures 1701. Here, certain of the epitaxial structures 1701 can be sized and spaced to form edge termination structures 1701-1, while other epitaxial structures 1701 will be used to form p-type contacts 1701-2 and buried structures 1701-3. For example, according to some embodiments, the p-type contacts 1701-2 can range from 2 µm to 20 µm wide, and the buried structures 1701-3 can range from 0.5 µm to 10 µm wide. Additionally, according to some embodiments, the distance between buried structures 1701-3 and/or contacts 1701-2 can range from 0.2 µm to 10 µm in length. In this embodiment, the n-type epitaxial regrowth layer 1702 can further relax potential between floating p-type edge termination structures 1701-1. One of ordinary skill in the art would recognize such passivation can be utilized in other embodiments provided herein.

Figure 17D:
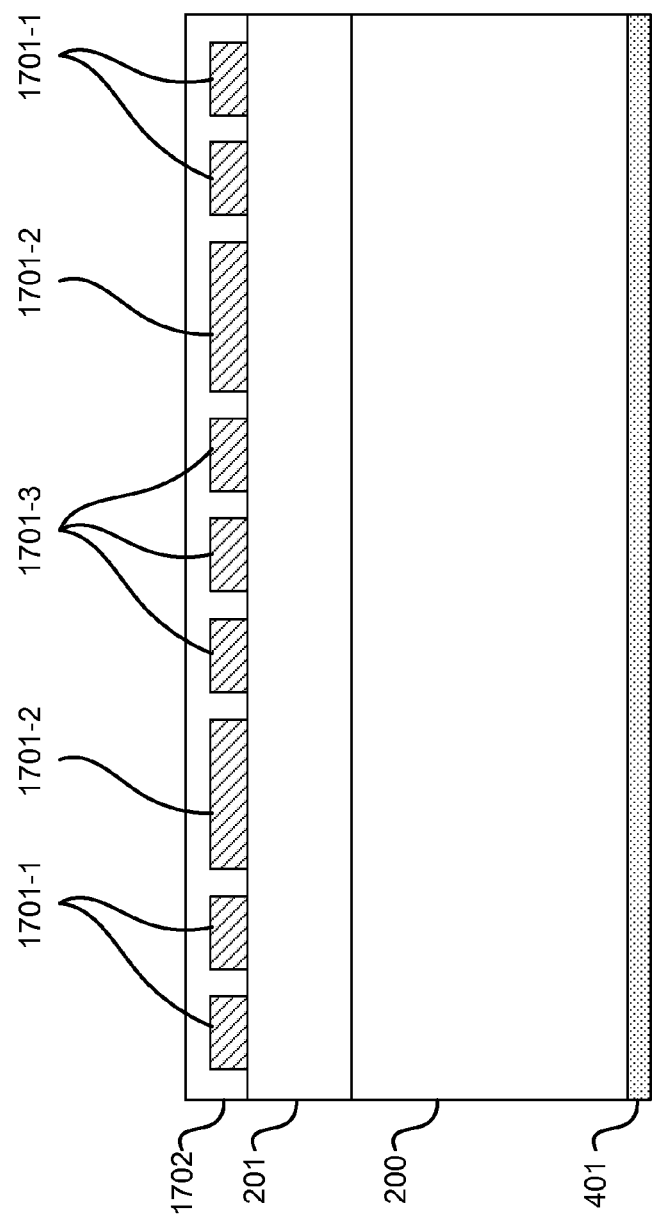

FIG. 17D illustrates the formation of a first metallic structure 401 below the GaN substrate 200. The first metallic structure 401 can be one or more layers of ohmic metal that serve as a contact for the cathode of the GaN Schottky diode. The physical properties of the first metallic structure 401 can be similar to the corresponding structure described in respect to FIG. 4.

Figure 17E:
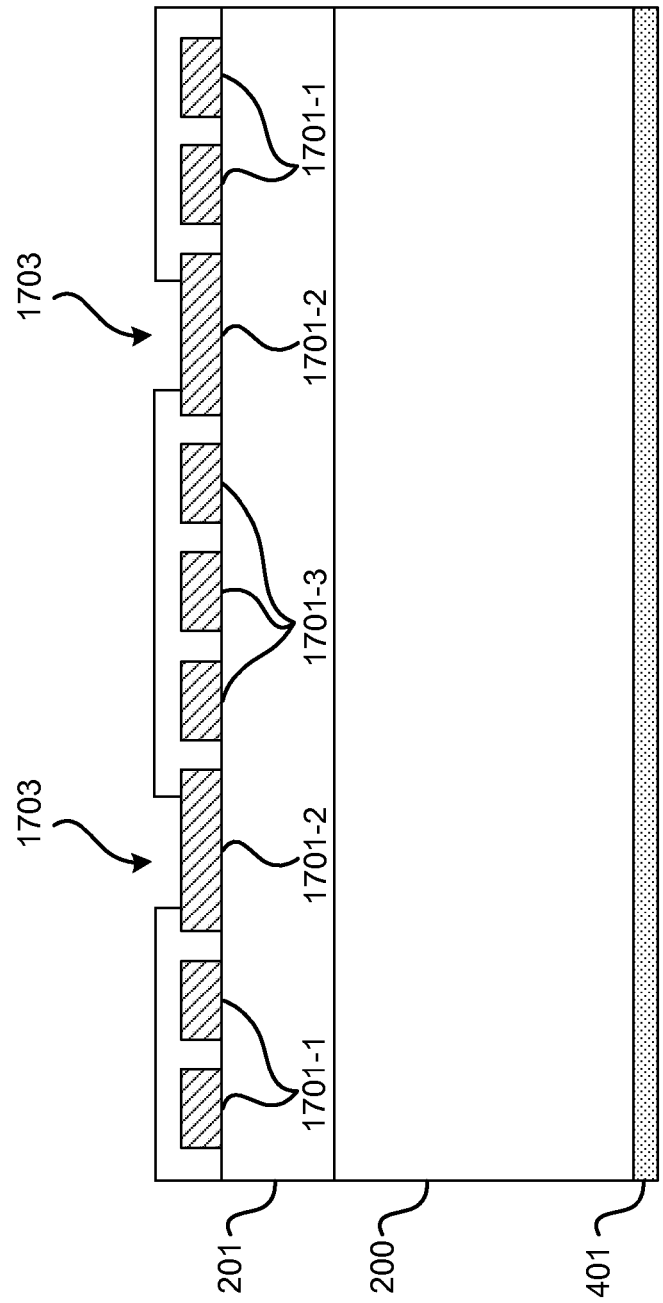

FIG. 17E illustrates removal of the n-type epitaxial regrowth layer 1702 to form openings 1703, exposing at least a portion of the p-type contacts 1701-2. The removal can be performed by a controlled etch using an etch mask (not shown) designed to stop at approximately the top surface of the p-type contacts 1701-2. In other embodiments, the process terminates at a different depth, for example, extending into p-type contacts 1701-2. Inductively-coupled plasma (ICP) etching and/or other common GaN etching processes can be used.

Figure 17F:
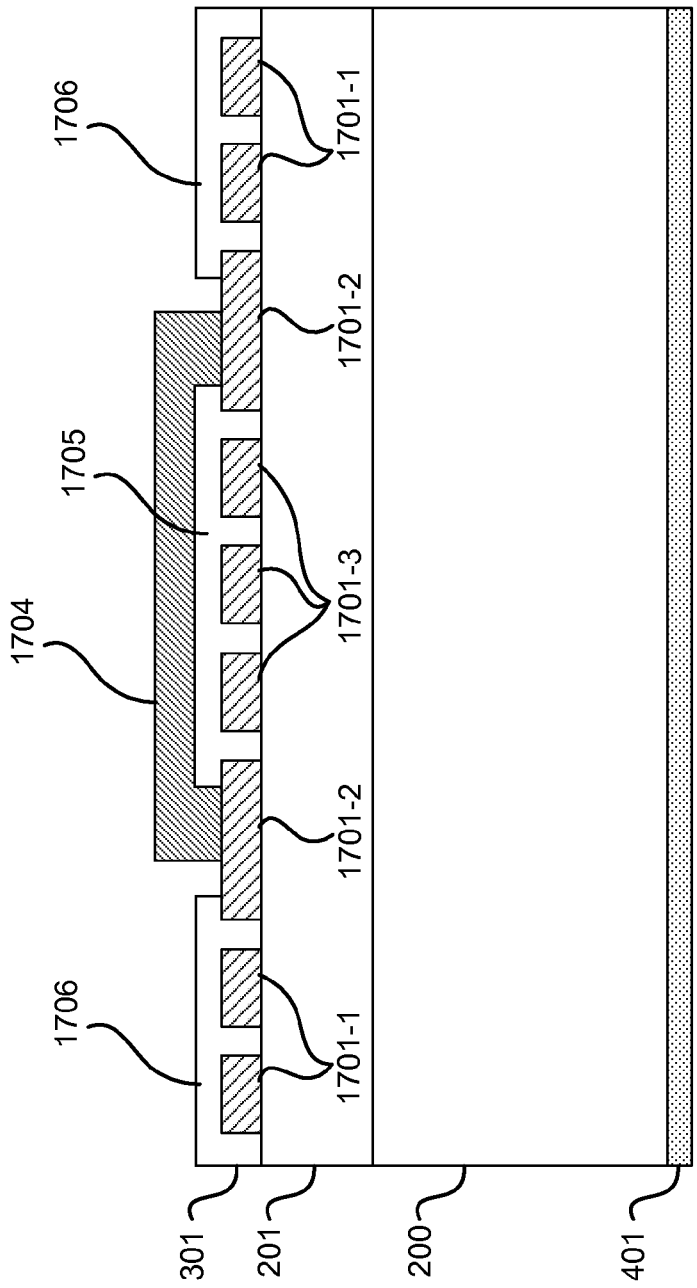

As shown in FIG. 17F, a Schottky metal 1704 then can be coupled with p-type contacts 1701-2 and a portion 1705 of the n-type epitaxial regrowth layer above the buried structures 1701-3. The Schottky metal 1704 can be formed using a variety of techniques, including lift-off and/or deposition with subsequent etching, which can vary depending on the metals used. In some embodiments, the Schottky metal 1704 can include nickel, platinum, palladium, silver, gold, and the like.

The formation of the Schottky metal 1704 creates a Schottky contact with the portion 1705 of the n-type epitaxial regrowth layer. Because the portion 1705 of the n-type epitaxial regrowth layer can be formed by regrowth, the surface to which the Schottky metal 1704 is coupled does not require the cleaning and/or annealing steps typically required to correct damage due to other processes, such as dry etching. Because the Schottky metal 1704 also forms ohmic contact with p-type contacts 1701-2, a merged P-i-N Schottky (MPS) diode is formed, having edge-termination provided by edge termination structures 1701-1 and n-type passivation portions 1706. In addition to the low capacitance and very low leakage current in the off state provided by the MPS structure, performance of the diode is further enhanced with the inclusion of buried structures 1701-3, which can serve to pinch off current flow under reverse bias.

In a specific embodiment, at least a portion of the p-type GaN epitaxial layer can be removed, a process that can include forming a plurality of p-type device structures using a remaining portion of the p-type GaN epitaxial layer. In this specific embodiment, the fabrication process includes forming an n-type GaN passivation layer coupled to the at least one edge termination structure and the plurality of p-type device structures, removing a portion of the n-type GaN passivation layer to expose a portion of at least one p-type device structure, and forming a second metallic structure electrically coupled to the exposed portion of the at least one p-type device structure and a remaining portion of the n-type GaN passivation layer. Semiconductor structures formed according to embodiments of the present invention can thus include a plurality of a III-nitride epitaxial structures of a second conductivity type coupled to the III-nitride epitaxial layer. The semiconductor structures can also include a III-nitride passivation layer of the first conductivity type coupled to the plurality of a III-nitride epitaxial structures and a second metallic structure electrically coupled to at least one of the plurality of III-nitride epitaxial structures and a portion of the III-nitride passivation layer.

FIGS. 18A-18E are cross-sectional diagrams of another process for forming a GaN Schottky diode with a buried p-type layer with edge termination structures. The process can begin at FIG. 18A with a structure similar to that shown in FIGS. 3 and 17A, with a first GaN epitaxial layer 201 coupled to a GaN substrate 200, and a second GaN epitaxial layer 301 coupled to the first GaN epitaxial layer 201. In this embodiment, the first GaN epitaxial layer 201 and the GaN substrate 200 are have n-type conductivity, and the second GaN epitaxial layer 301 has a p-type conductivity. The physical properties of the structures shown in FIG. 18A can be similar to corresponding structures described in respect to in FIGS. 3 and 17A.

Figure 18A:
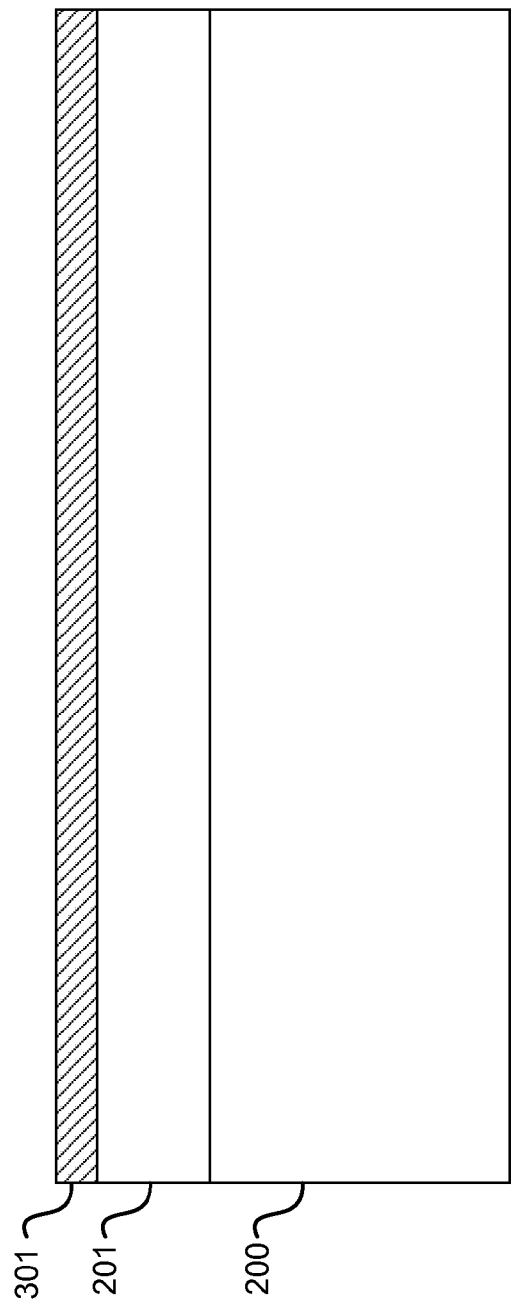
FIGS. 18A-18E are cross-sectional diagrams of process for forming a GaN Schottky diode with a buried p-type layer with edge termination structures, according to another embodiment.
Figure 18B:
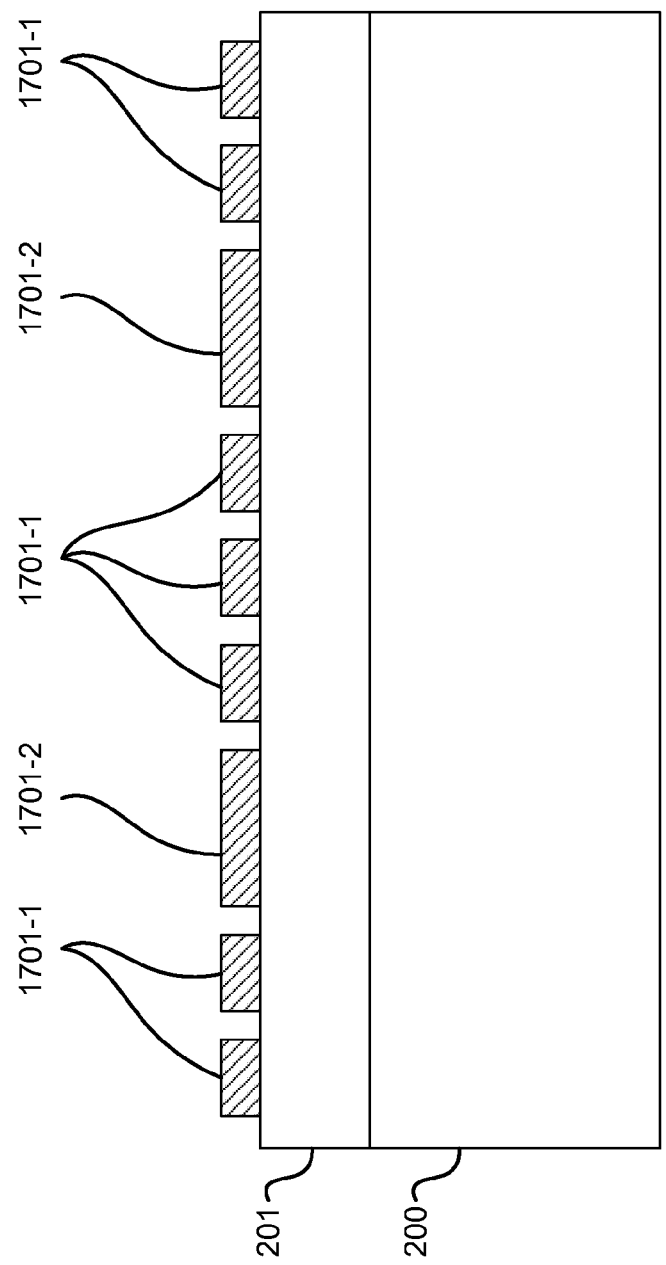
Figure 18C:
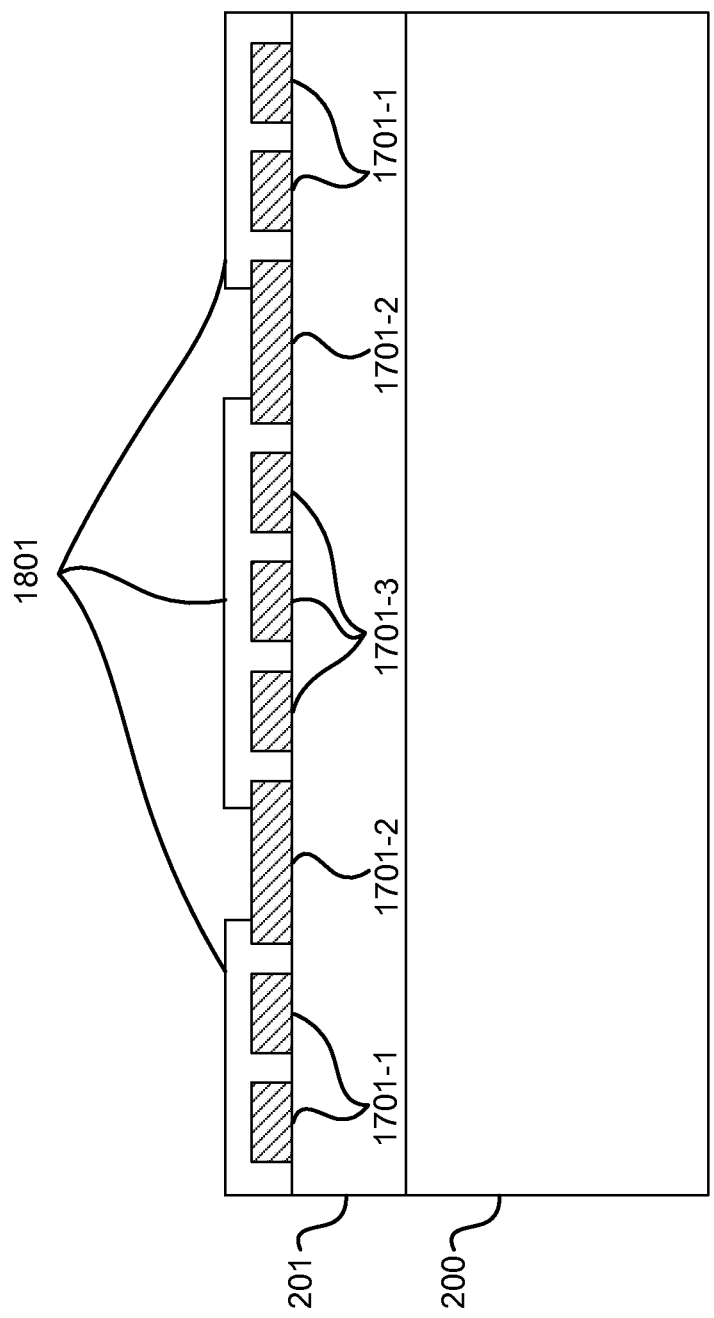

In FIG. 18B, the second GaN epitaxial layer 301 is etched to form multiple epitaxial structures 1701, and in FIG. 18C, an n-type epitaxial regrowth layer 1801 for passivation is selectively formed over the epitaxial structures 1701. Here, certain of the epitaxial structures 1701 can be sized and spaced to form edge termination structures 1701-1, while other epitaxial structures 1701 will be used to form p-type contacts 1701-2 and buried structures 1701-3. For example, according to some embodiments, the p-type contacts 1701-2 can range from 2 µm to 20 µm wide, and the buried structures 1701-3 can range from 0.5 µm to 10 µm wide. Additionally, according to some embodiments, the distance between buried structures 1701-3 and/or contacts 1701-2 can range from 0.2 µm to 10 µm in length. In this embodiment, the n-type epitaxial regrowth layer 1801 can further relax potential between floating p-type edge termination structures 1701-1. One of ordinary skill in the art would recognize such passivation can be utilized in other embodiments provided herein. Additional description related to selective regrowth of III-nitride layers is provided in commonly assigned U.S. patent application Ser. No. 13/225,345 filed Sep. 2, 2011 and hereby incorporated by reference in its entirety for all purposes.

Figure 18D:
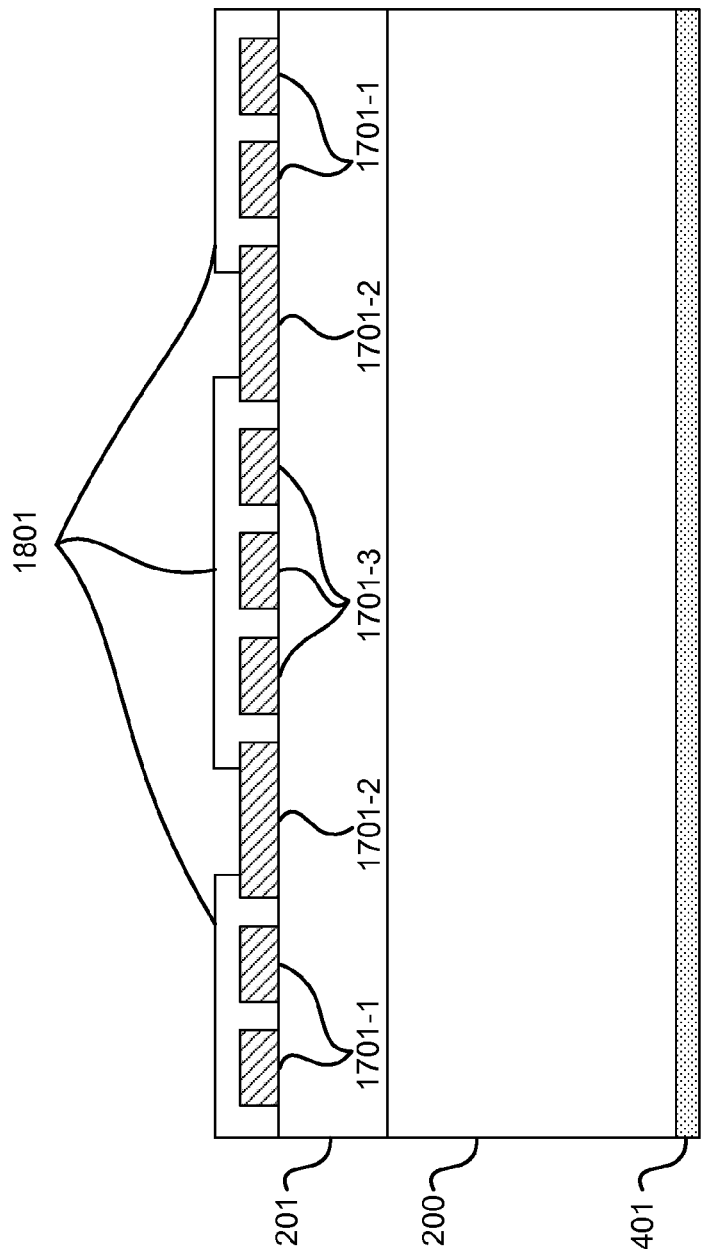

FIG. 18D illustrates the formation of a first metallic structure 401 below the GaN substrate 200. The first metallic structure 401 can be one or more layers of ohmic metal that serve as a contact for the cathode of the GaN Schottky diode. The physical properties of the first metallic structure 401 can be similar to the corresponding structure described in respect to FIG. 4.

Figure 18E:
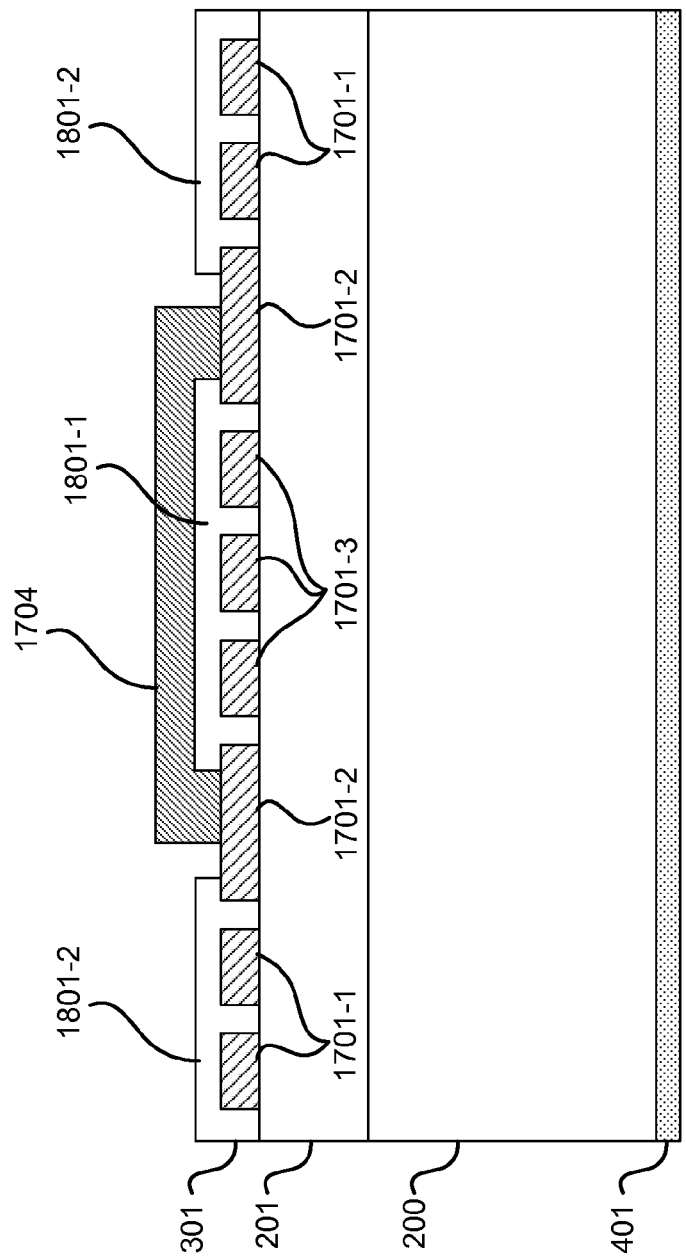

As shown in FIG. 18E, and similar to FIG. 17F, a Schottky metal 1704 then can be formed and electrically coupled to p-type contacts 1701-2 and a portion 1801-1 of the n-type epitaxial regrowth layer above the buried structures 1701-3. The Schottky metal 1704 can be formed using a variety of techniques, including lift-off and/or deposition with subsequent etching, which can vary depending on the metals used. In some embodiments, the Schottky metal 1704 can include nickel, platinum, palladium, silver, gold, and the like. The properties and advantages of the resulting structure are similar to those discussed in reference to FIG. 17A-17F.

Figure 19:
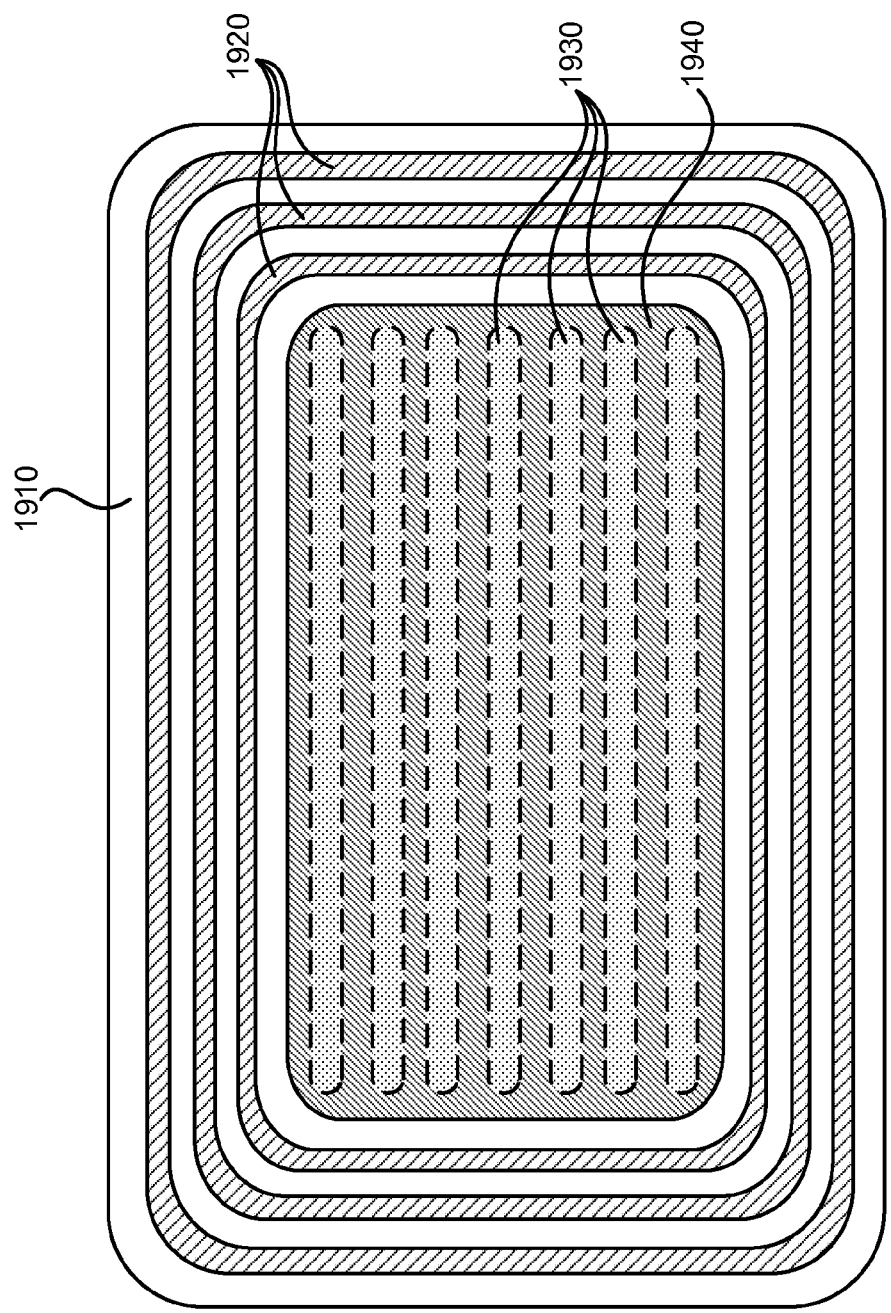
FIG. 19 is an illustration of an overhead view of an embodiment of a diode formed in either FIGS. 17A-17F or FIGS. 18A-18E.

FIG. 19 illustrates an overhead view of an embodiment of a diode formed in either FIGS. 17A-17F or FIGS. 18A-18E. (For ease of viewing, the n-type epitaxial regrowth layer 1702 is omitted.) Here, floating guard rings 1920 are formed on a drift layer 1910, as well as the buried p-type structures 1930. After forming openings in the n-type epitaxial regrowth layer 1702 (not shown) to expose one or more of the p-type structures to form contacts (corresponding to p-type contacts 1701-2 of FIG. 17E), a Schottky metal 1940 is deposited.

One of ordinary skill in the art would recognize many variations, modifications, and alternatives to the examples provided herein. As illustrated herein, edge termination structures can be provided in any of a variety of shapes and forms, depending on physical features of the semiconductor device for which the edge termination structures provide edge termination. For instance, in certain embodiments, edge termination structures may not circumscribe the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a diode in gallium nitride (GaN) materials, the method comprising:
   providing a n-type GaN substrate having a first surface and a second surface;
   forming a first n-type GaN epitaxial layer coupled to the first surface of the n-type GaN substrate;
   forming a p-type GaN epitaxial layer coupled to the first n-type GaN epitaxial layer;
   removing at least a portion of the p-type GaN epitaxial layer to form a plurality of p-type device structures;
   forming a second n-type GaN epitaxial layer coupled to the plurality of p-type device structures;
   removing at least a portion of the second n-type GaN epitaxial layer to expose a portion of at least one p-type device structure; and
   forming a first metallic structure electrically coupled to the exposed portion of the at least one p-type device structure and a remaining portion of the second n-type GaN epitaxial layer, wherein the first metallic structure is not in direct contact with the first n-type GaN epitaxial layer, and wherein a portion of the exposed portion of the at least one p-type device structure remains exposed.

2. The method of claim 1 wherein the first metallic structure forms a Schottky contact with the remaining portion of the second n-type GaN epitaxial layer.

3. The method of claim 1 wherein the first metallic structure forms an ohmic contact with the exposed portion of the at least one p-type device structure.

4. The method of claim 1 wherein forming the plurality of p-type device structures includes forming one or more edge termination structures.

5. The method of claim 4 wherein the one or more edge termination structures circumscribe the first metallic structure.

6. The method of claim 1 wherein forming the first metallic structure includes forming the first metallic structure such that one or more p-type device structures are disposed between the first n-type GaN epitaxial layer and the first metallic structure.

7. The method of claim 1 further comprising forming a second metallic structure electrically coupled to the second surface of the n-type GaN substrate.

8. The method of claim 1 wherein:
the n-type GaN substrate is characterized by a first n-type dopant concentration; and
the first n-type GaN epitaxial layer is characterized by a second n-type dopant concentration less than the first n-type dopant concentration.

9. A method of fabricating an epitaxial structure, the method comprising:
providing a III-nitride substrate of a first conductivity type;
forming a first III-nitride epitaxial layer of the first conductivity type coupled to a first surface of the III-nitride substrate;
forming a second III-nitride epitaxial layer of a second conductivity type coupled to the first III-nitride epitaxial layer;
removing at least a portion of the second III-nitride epitaxial layer to form a plurality of epitaxial structures of the second conductivity type;
forming a third III-nitride epitaxial layer of the first conductivity type coupled to the plurality of epitaxial structures; and
forming a first metallic structure electrically coupled to at least one of the plurality of epitaxial structures and a portion of the third III-nitride epitaxial layer, wherein the first metallic structure is not in direct contact with the first III-nitride epitaxial layer, and wherein a portion of the at least one epitaxial structure remains exposed.

10. The method of claim 9 wherein forming the third III-nitride epitaxial layer comprises a selective regrowth process.

11. The method of claim 9 further comprising removing at least a portion of the third III-nitride epitaxial layer.

12. The method of claim 9 wherein the first metallic structure is configured to form a Schottky contact with the third III-nitride epitaxial layer.

13. The method of claim 9 wherein the first metallic structure forms an ohmic contact with the at least one of the plurality of epitaxial structures.

14. The method of claim 9 wherein forming the plurality of epitaxial structures includes forming one or more edge termination structures.

15. The method of claim 9 wherein forming the first metallic structure includes forming the first metallic structure such that one or more epitaxial structures are disposed between the first III-nitride epitaxial layer and the first metallic structure.

16. The method of claim 9 further comprising forming a second metallic structure electrically coupled to a second surface of the III-nitride substrate.

17. The method of claim 9 wherein the first conductivity type is n-type and the second conductivity type is p-type.

18. A semiconductor structure comprising:
a III-nitride substrate characterized by a first conductivity type and having a first side and a second side opposing the first side;
a III-nitride epitaxial layer of the first conductivity type coupled to the first side of the III-nitride substrate;
a plurality of III-nitride epitaxial structures of a second conductivity type coupled to the III-nitride epitaxial layer;
a III-nitride epitaxial formation of the first conductivity type coupled to the plurality of III-nitride epitaxial structures; and
a metallic structure forming a Schottky contact with the III-nitride epitaxial formation and coupled to at least one of the plurality of III-nitride epitaxial structures, wherein the metallic structure is not in direct contact with the III-nitride epitaxial layer, and wherein a portion of the at least one III-nitride epitaxial structure remains exposed.

19. The semiconductor structure of claim 18 wherein the first metallic structure forms an ohmic contact with the at least one of the plurality of III-nitride epitaxial structures.

20. The semiconductor structure of claim 18 wherein the plurality of III-nitride epitaxial structures includes one or more edge termination structures.

21. The semiconductor structure of claim 18 wherein one or more of the plurality of III-nitride epitaxial structures is disposed between the III-nitride epitaxial layer and the metallic structure.

22. The semiconductor structure of claim 18 further comprising forming a second metallic structure electrically coupled to the second side of the III-nitride substrate.

* * * * *